United States Patent [19]

Buelow et al.

[11] 4,132,898
[45] Jan. 2, 1979

[54] OVERLAPPING BOUNDARY ELECTRON EXPOSURE SYSTEM METHOD AND APPARATUS

[75] Inventors: Fred K. Buelow, Los Altos Hills; John J. Zasio, Sunnyvale; Laurence H. Cooke, Cupertino, all of Calif.

[73] Assignee: Fujitsu Limited, Kawasaki, Japan

[21] Appl. No.: 847,476

[22] Filed: Nov. 1, 1977

[51] Int. Cl.$^2$ .............................................. A61K 27/02
[52] U.S. Cl. ............................. 250/492 A; 250/492 B
[58] Field of Search ................................. 250/492 A

[56] References Cited

U.S. PATENT DOCUMENTS

| 3,875,416 | 4/1975 | Spicer | 250/492 A |
|---|---|---|---|
| 3,900,737 | 8/1975 | Collier et al. | 250/492 A |

Primary Examiner—Harold A. Dixon
Attorney, Agent, or Firm—David E. Lovejoy

[57] ABSTRACT

An electron beam exposure apparatus and method for use in fabricating semiconductor devices. A chip pattern larger in area than the electron beam scan field is divided into and exposed in a number of smaller parts (called partitions). The work piece on which the chip pattern is to be formed is moved relative to the scan field to enable each partition to be individually scanned at a different work piece position. The scan field, with the work piece positioned to scan one partition, overlaps onto and establishes a boundary region on an adjacent partition. Portions of chip patterns which lie in a boundary region are selectively scanned in connection with one or another of the abutting partitions. Portions of chip patterns falling in the boundary regions are selected for scanning in one or the other of adjacent partitions so as to minimize the number of divisions and so as to avoid dividing the pattern along critical dimensions.

18 Claims, 12 Drawing Figures

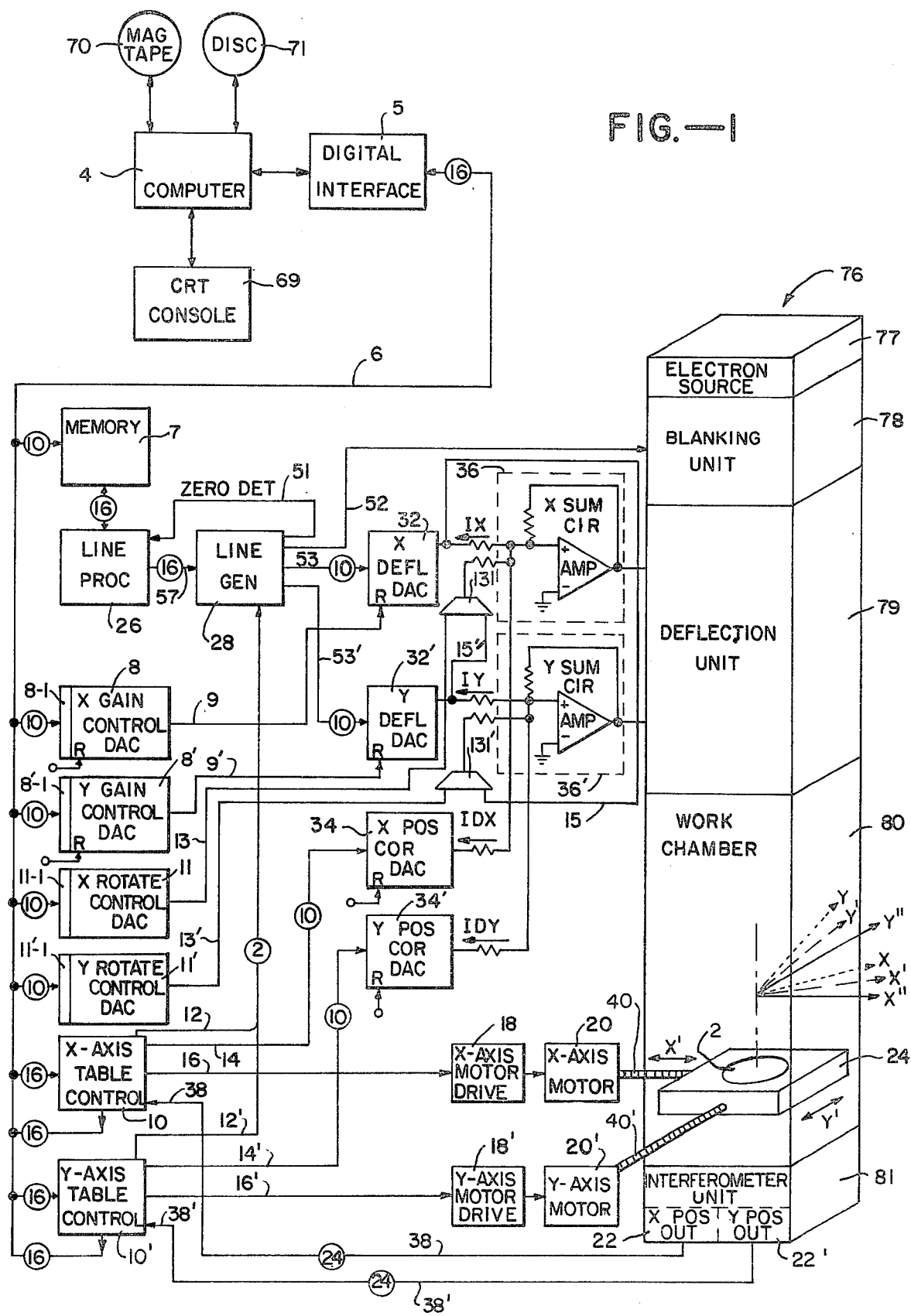
FIG.—1

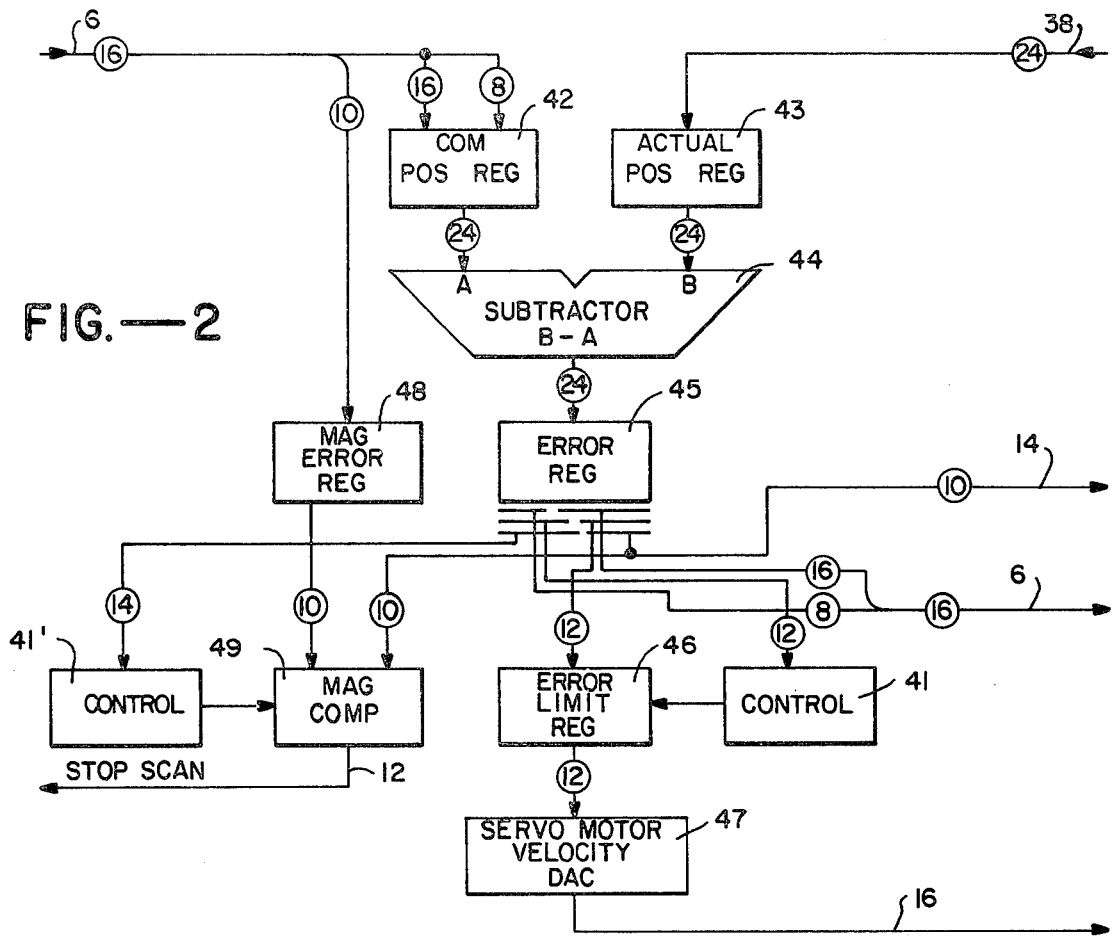
FIG.—2
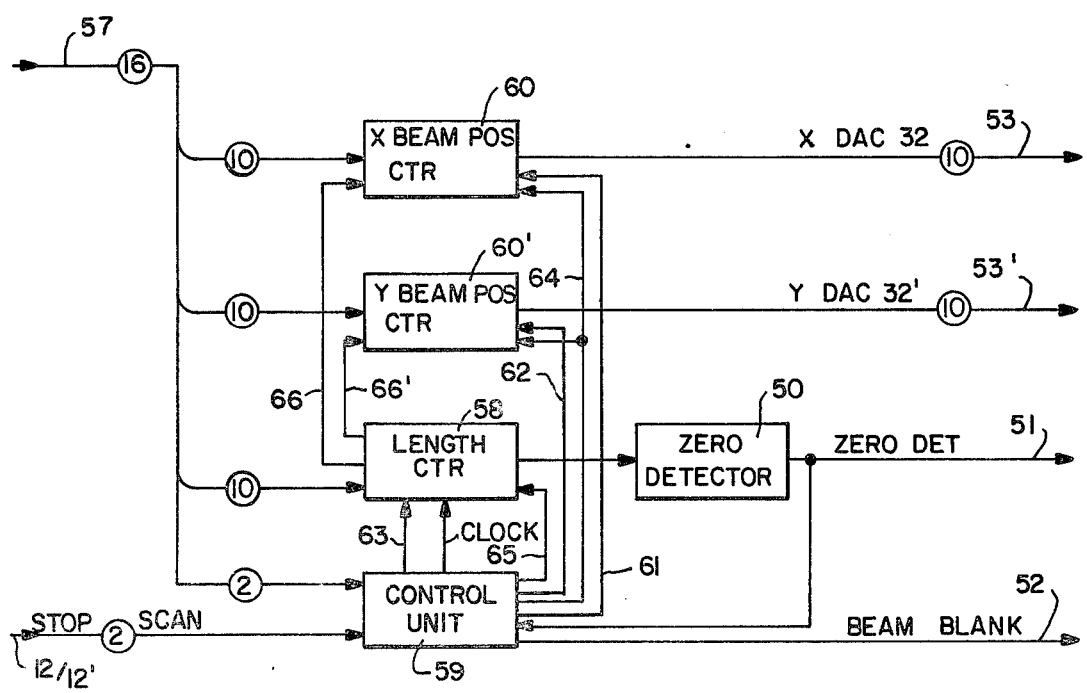
FIG.—3

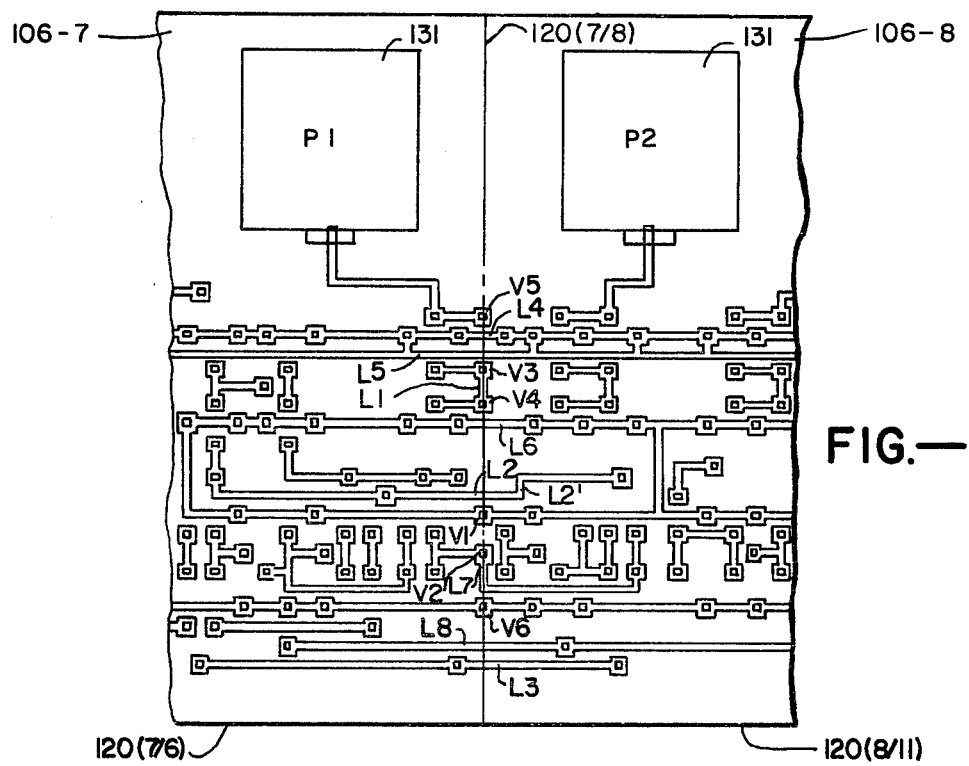
FIG.—9
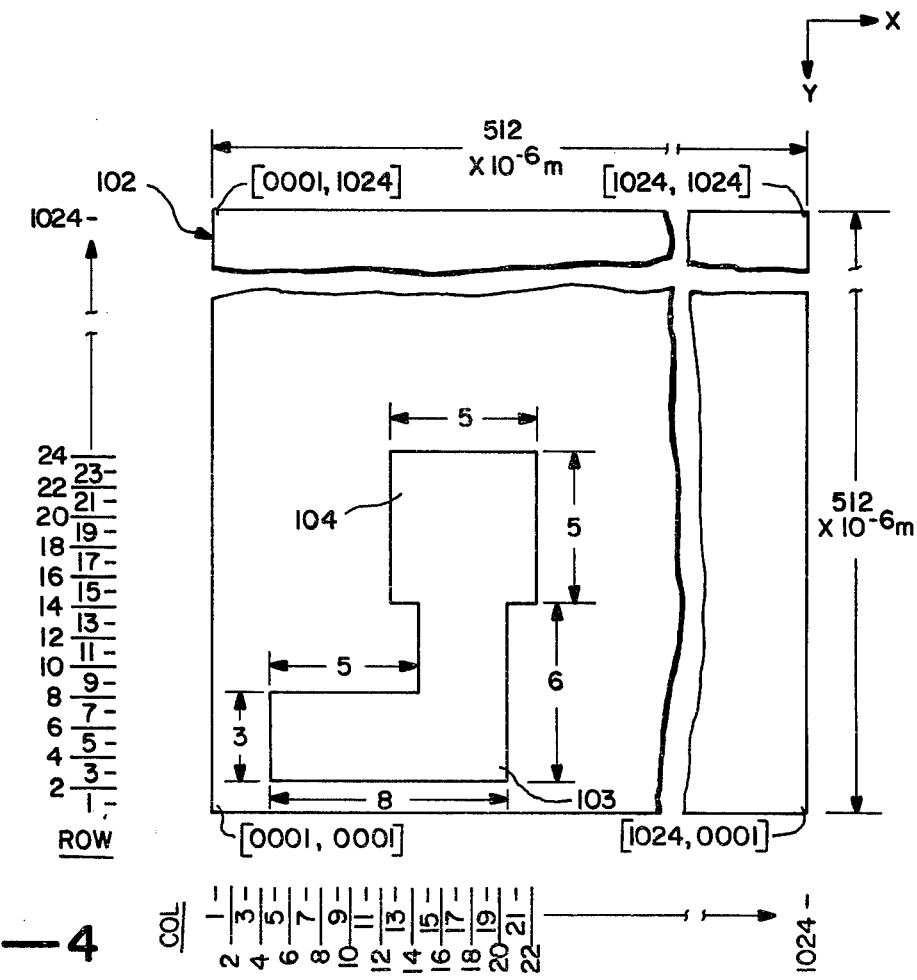
FIG.—4

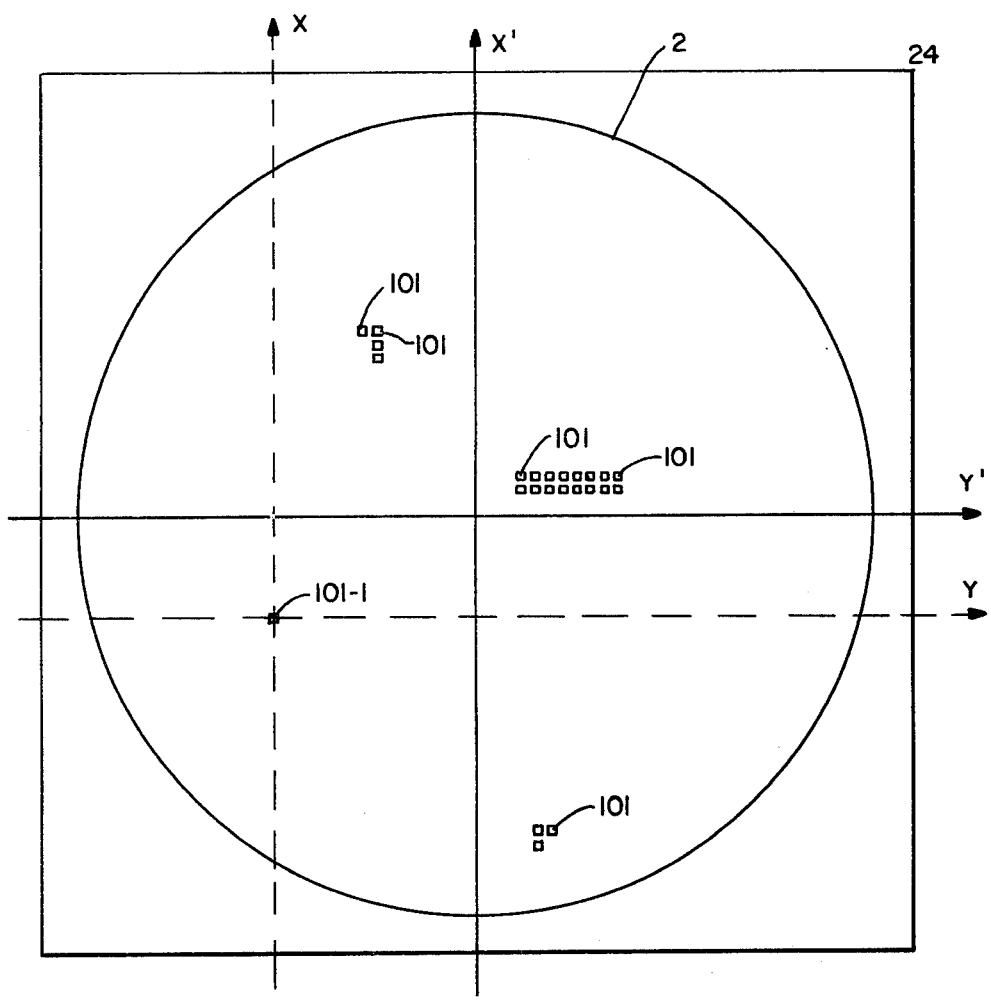
FIG.—5
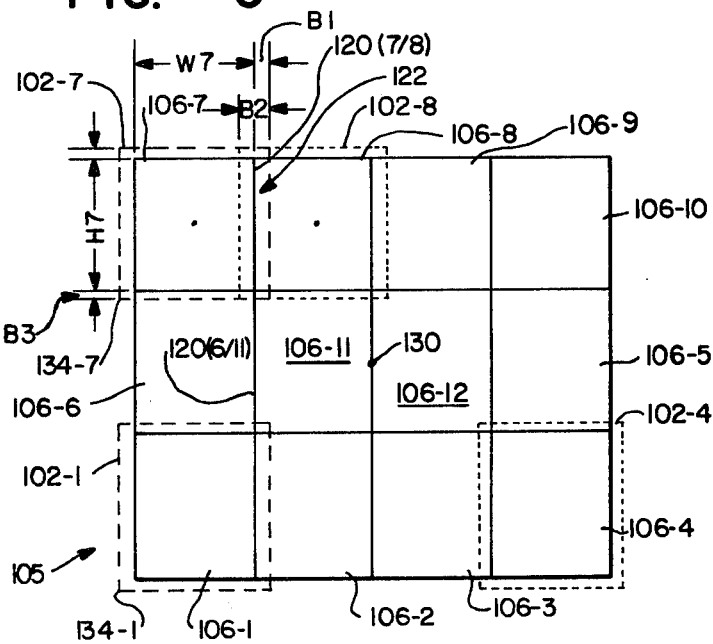
FIG.—6
FIG.—7

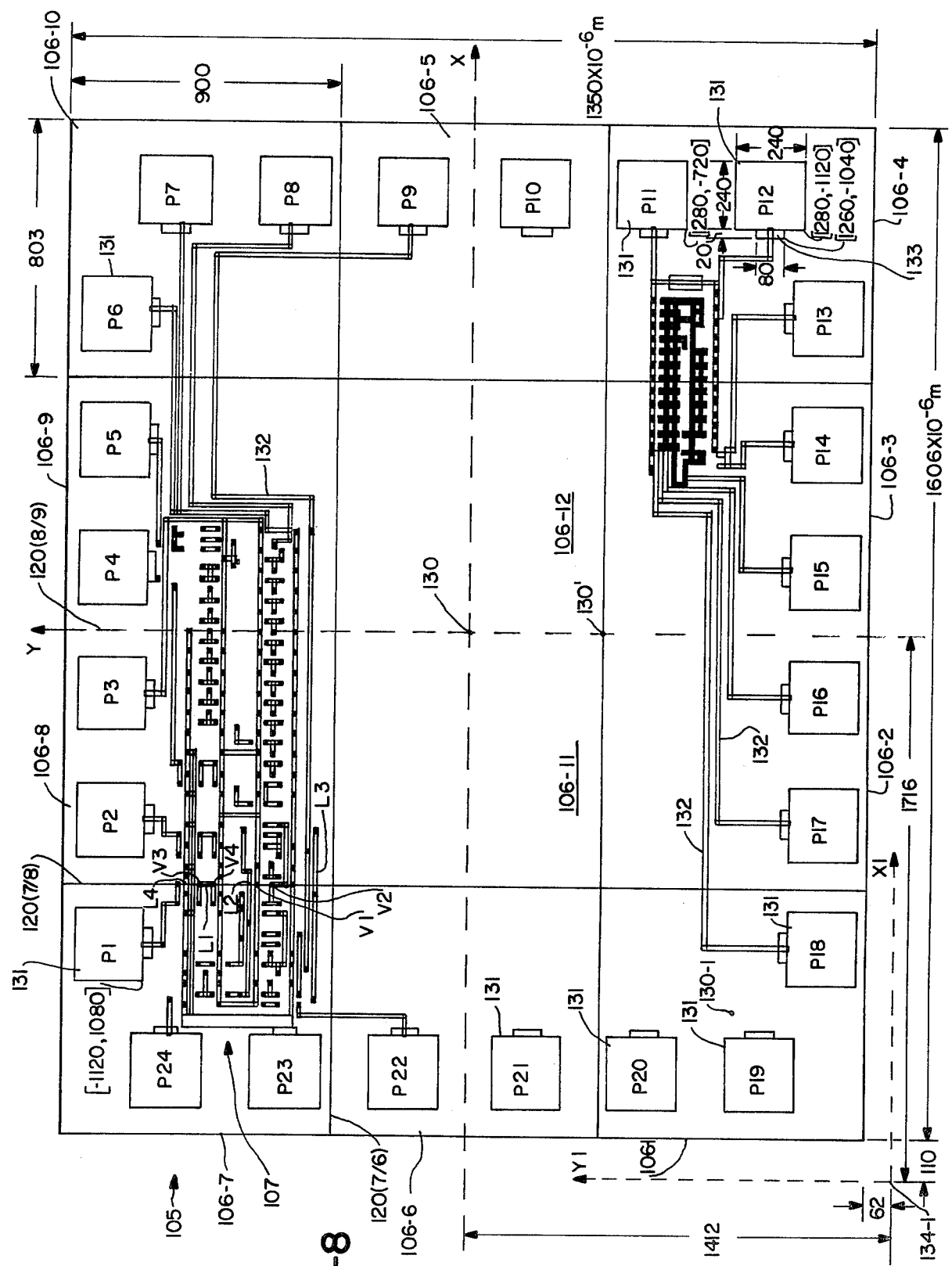

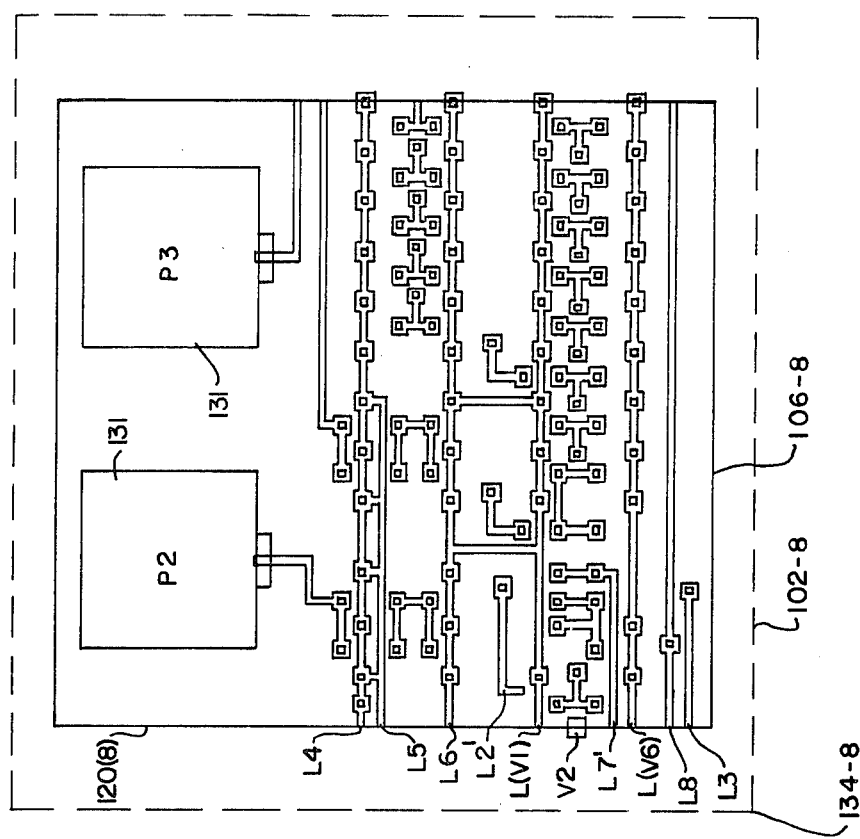
FIG.—11
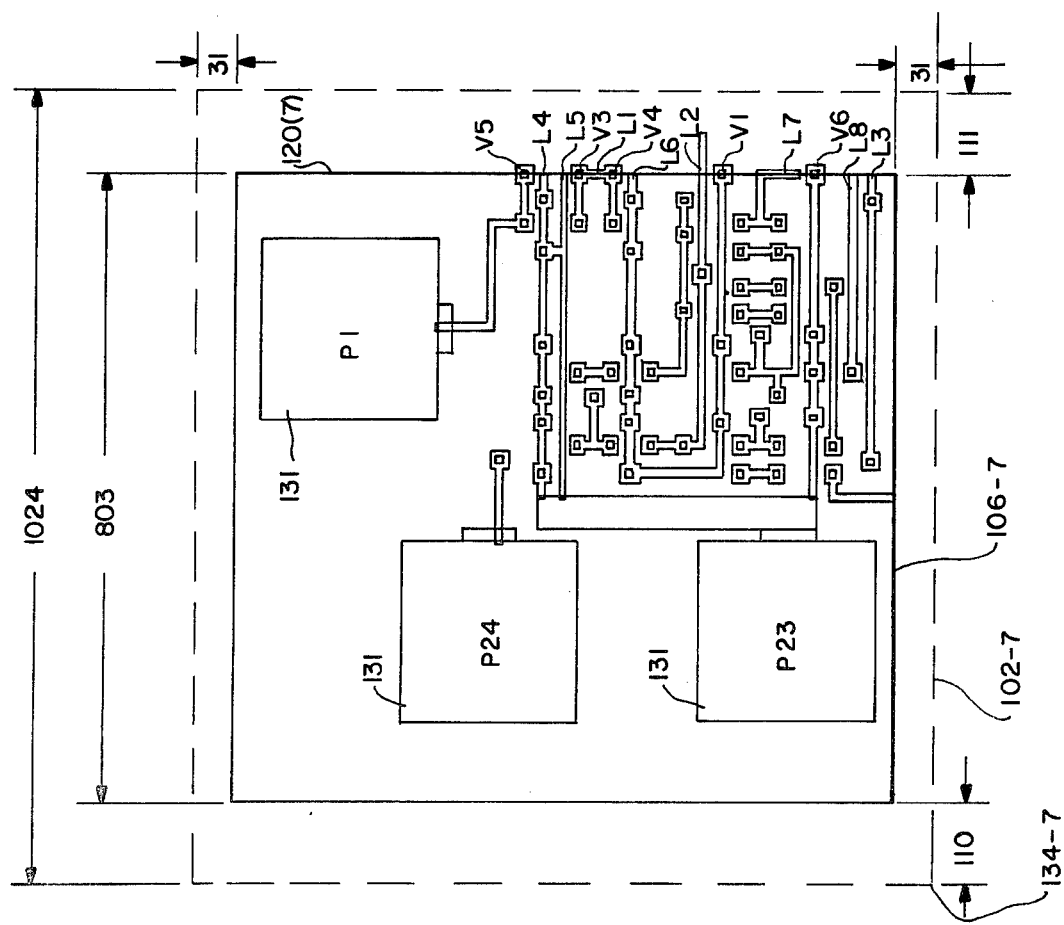
FIG.—10

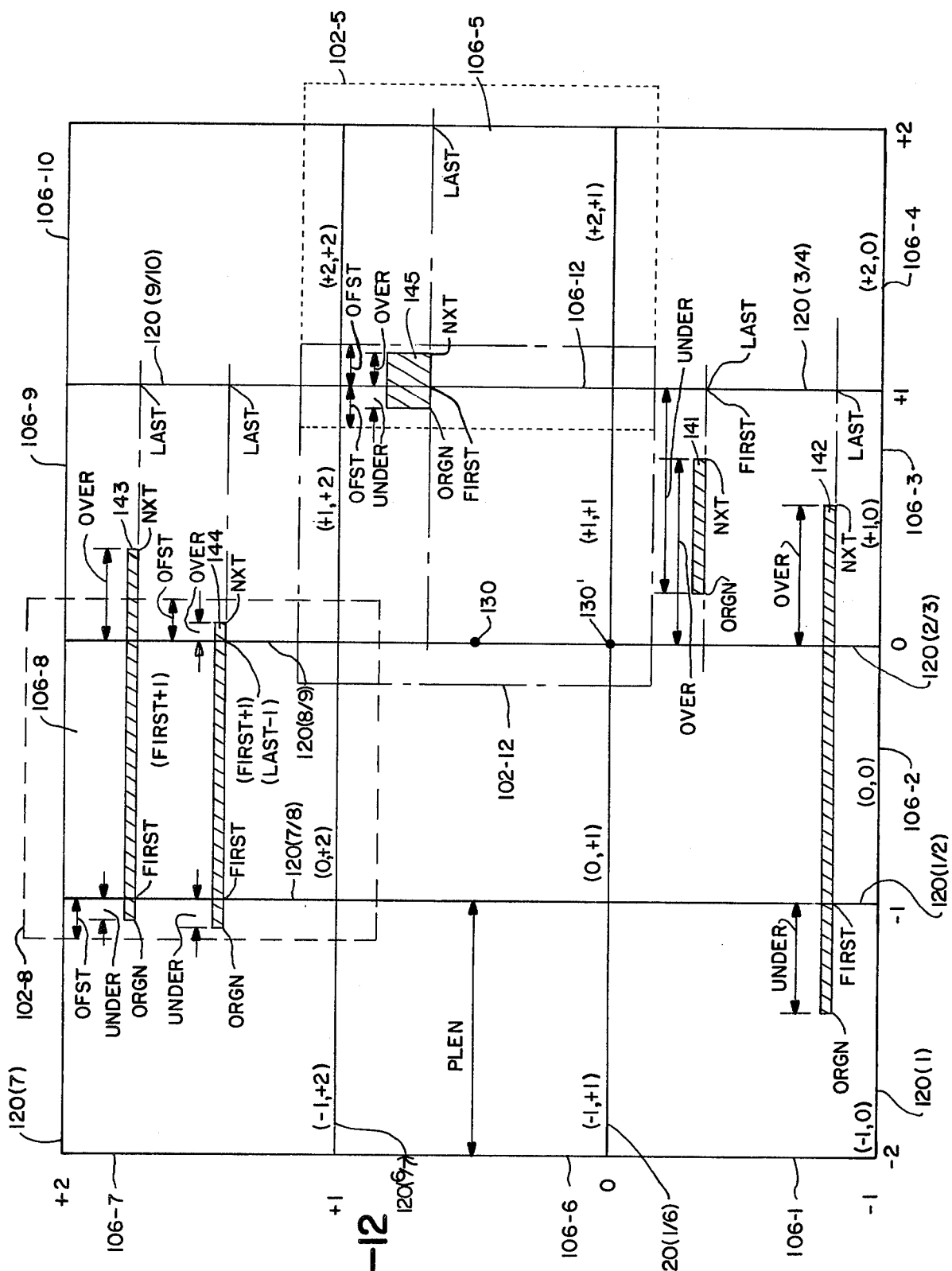
FIG.—12

OVERLAPPING BOUNDARY ELECTRON EXPOSURE SYSTEM METHOD AND APPARATUS

CROSS REFERENCE TO RELATED APPLICATIONS

ELECTRON BEAM SYSTEM, Ser. No. 847,485, filed Nov. 11, 1977, invented by Fred K. Buelow and John J. Zasio and assigned to the assignee of the present invention.

BACKGROUND OF THE INVENTION

This invention relates to the fabrication of microminiature devices and, more particularly, to an automated, high-speed electron beam apparatus and method for making such devices.

It has long been known that the high-resolution and excellent depth-of-focus capabilities of an electron beam make it a practical tool for inclusion in an automated system for making microminiature electronic devices. The electron beam is controlled in a highly accurate and high-speed manner to expose an electron-resist-coated material as a step in the fabrication of extremely small and precise low-cost integrated circuits.

Although an electron beam can be deflected and blanked in a high-speed manner, the scan area over which the beam is capable of being accurately deflected is relatively small. A basic problem presented, therefore, is how to utilize an electron beam which has a small-area scan field to rapidly and accurately expose relatively large chip pattern areas.

In addition to the need for exposing large areas, large densities of circuits are desired on semiconductor chips. The trend in the industry has been towards a greater number of circuits per unit of area and towards smaller circuit elements. With this trend, it has become increasingly possible to integrate an entire system or subsystem on one or a relatively few number of semiconductor chips.

In order to accommodate the greater density of circuits and to obtain the accuracy required for smaller circuit elements, electron beam systems are employed to scan chip patterns or portions of chip patterns each covering an area which is equal to or less than the scan field area which can be accurately scanned by the electron beam.

When the chip pattern to be scanned covers an area greater than the area which can be accurately scanned by the electron beam, the chip pattern is divided into partitions where each partition has an area which is small enough to fit within the scan field of the electron beam. The partitions are then scanned one at a time. After scanning each partition, the work piece (wafer or other material to be scanned) is moved so that the electron beam scan field is relocated for scanning the next adjacent partition. In this manner, the entire chip pattern is scanned one partition at a time.

In order that the composite chip pattern be accurately scanned, each partition must be accurately scanned. Furthermore, adjacent partitions must be properly aligned (that is, properly registered) with respect to each other. Failure to have proper registration means that circuit elements crossing the boundry between partitions will be misaligned. This problem of partition alignment is a problem of registering the electron beam scan field on the work piece each time the work piece is moved.

Problems arise in connection with the registration of the scan field particularly when circuit elements having critical dimensions are located at or near the boundary between adjacent partitions. If a circuit element having a critical dimension is located across a partition boundary, portions of the circuit element will normally be scanned at two different times with two different positions of the work piece relative to the electron beam scan field.

If the electron beam scan field position at one location of the work piece is misaligned relative to its position at an adjacent position of the work piece, then an error due to the misalignment will be introduced into the scanning of the circuit element crossing the boundary. If the magnitude of the misalignment is large with respect to critical dimensions of the circuit element being scanned, the circuit element will be significantly malformed.

The problem of how to accurately register and reregister the scan field on a work piece is well known. Many different solutions for this problem have been proposed and have been employed with various degrees of success. Many of these solutions employ alignment marks within each partition for use in connection with registering the scan field when the work piece is moved. While the use of alignment marks in various forms is useful and desirable, there is still a need for an improved method and apparatus for avoiding the problems caused by misalignment of adjacent partitions.

In accordance with the above background of the invention, it is an object of the present invention to provide an improved electron beam apparatus and method for successively scanning smaller partitions to form a larger composite chip pattern.

SUMMARY OF THE INVENTION

The present invention is an electron beam apparatus and method for scanning a chip pattern. The chip pattern is divided into partitions, each smaller than the overall chip pattern. Also, each partition is smaller than the scan field of the electron beams. The partitions are scanned by the electron beam one at a time so that the overall chip pattern is formed as a composite of the individual partitions. A work piece on which the chip pattern is to be scanned is moved to a different position relative to the electron beam scan field each time a different partition is to be scanned.

Since the scan field of the electron beam is larger than each partition, the scan field positioned to scan one partition overlaps onto an adjacent partition. Each partition, therefore, has a boundary region which is overlapped by the scan field at more than one position of the work piece. Any portion of the chip pattern which falls within such a boundary region may be scanned at more than one position of the work piece. Since only one scanning is desired, a selection is made, in accordance with the present invention, as to which position of the work piece such a portion of the chip pattern is scanned. The selection is made so as to minimize the division of circuit elements and so as to avoid division of circuit elements in those regions which have critical dimensions and which would, therefore, cause registration problems.

Accordingly, those portions of a circuit element having critical dimensions tend to be exposed in a single scanning with the work piece at one location. In this manner, such critical dimensions are accurately scanned and are immune to any misalignment of the electron beam scan field when the work piece is moved from one position to an adjacent position.

In accordance with the above summary, the present invention achieves the objective of providing an improved electron beam apparatus and method for scanning an electron beam to expose a chip pattern by means of overlapping boundary scan fields and selective scanning of portions of the chip pattern.

Additional objects and features of the invention will appear from the following description in which the preferred embodiments of the invention have been set forth in detail in conjunction with the drawings.

BRIEF DESCRIPTION OF THE DRAWINGS

FIG. 1 depicts an overall electrical schematic block diagram of an electron beam apparatus in accordance with the present invention.

FIG. 2 depicts one of the two table controls which form part of the FIG. 1 apparatus.

FIG. 3 depicts a line generator which is one component within the FIG. 1 apparatus.

FIG. 4 depicts a representation of the electron beam scan field produced by the FIG. 1 apparatus.

FIG. 5 depicts a top view of the table and work piece which are utilized in the FIG. 1 apparatus.

FIG. 6 depicts a representation of the FIG. 4 scan field at a reduced scale.

FIG. 7 depicts a chip area formed by a plurality of adjacent scan fields of the FIG. 4 type at the scale shown in FIG. 6.

FIG. 8 depicts a typical chip area having a chip pattern which has been partitioned in accordance with the present invention.

FIG. 9 depicts an expanded view shown along a line between two of the partitions of FIG. 8.

FIG. 10 depicts a view of a processed first one of the two partitions of FIG. 9.

FIG. 11 depicts a view of a processed second one of the two partitions of FIG. 9.

FIG. 12 depicts a representation of how the chip pattern partitioning is performed.

DETAILED DESCRIPTION

Overview-FIG. 1

In FIG. 1, a wafer or other work piece 2 to be exposed by an electron beam is positioned on the motor-driven table 24. The table 24 is located within the work chamber 80 of an electron beam column 76. The column 76 is a conventional device including an electron source 77, a blanking unit 78, a deflection unit 79, a work chamber 80, and an interferometer unit 81. The column 76 is typically like that manufactured by ETEC Corporation of Hayward, California.

The electron source 77 provides the electrons which are incident upon the work piece 2 on the table 24. Blanking unit 78 permits the electron beam to be focused on the work piece or blanks the electron beam to inhibit electrons in a conventional manner. The blanking unit 78 is selectively controlled to inhibit or pass the electron beam by the beam blanking control line 52 from the line generator 28.

The deflection unit 79 includes both X and Y deflection coils (not shown) for positioning the electron beam in the X and Y axes. The X coil is driven by the output from the X sum circuit 36. Similarly the Y coil is driven by the Y sum circuit 36'.

The sum circuits 36 and 36' provide the X and Y drive signals to the deflection unit by summing a number of input signals. First, the sum circuits 36 and 36' receive the IX and IY commanded position signals as inputs from converters 32 and 32', respectively, which in turn are commanded by the line generator 28 and processor 26. The IX and IY signals specify the location of the electron beam with respect to a unit size in some predetermined coordinate system. In one embodiment, the unit size is $0.5 \times 10^{-6}$ meter.

The sum circuits 36 and 36' also receive correction signals IDX and IDY, respectively, which correct the position of the electron beam with some correction unit size as a function of the measured position of the movable work piece 2 as measured by an interferometer unit 81. In one embodiment, the size of the correction signal is in units of $0.08 \times 10^{-6}$ meter. Accordingly, one unit of the IX position command signal ($0.5 \times 10^{-6}$ meter) summed with one unit of the IDX correction signal ($0.08 \times 10^{-6}$ meter) specifies a deflected distance of $0.58 \times 10^{-6}$ meter. Similarly, ten units of IX ($5.0 \times 10^{-6}$ meter) and 20 units of IDX ($1.6 \times 10^{-6}$ meter) specifies a deflected distance of $6.6 \times 10^{-6}$ meter.

The sum circuits 36 and 36' also receive rotation signals IRX and IRY, respectively, from units 131 and 131' for rotating the XY electron beam axes relative to the X'Y' axes of table 24. In FIG. 1, the work table 24 is driven in the X-axis direction by the X axis motor 20 and in the Y-axis direction by the Y axis motor 20' to precisely position the work piece 2 relative to the incident electron beam. The actual position of the work piece 2 and the table 24 is measured by the interferometer unit 81. Typically the interferometer unit 81 includes an interferometer for measuring the X axis position which provides an X position output 22. Similarly, the interferometer unit 81 includes a Y axis unit providing a Y position output 22'. One typical interferometer unit is manufactured by Hewlett Packard Corporation and is model number HP5501. Such a unit provides a 24-bit output which is capable of measuring the actual position of the work piece 2 and table 24 to approximately $0.08 \times 10^{-6}$ meter. The interferometer unit is capable of tracking movements at rates of approximately up to 15 centimeters per second. The X and Y position outputs 22 and 22' from the interferometer unit 81 are connected as inputs to the X and Y axis table controls 10 and 10' respectively. Controls 10 and 10' provide signals to the units 34 and 34' to generate the correction signals IDX and IDY, respectively. In FIG. 1, the control circuitry for controlling the electron beam column 76 includes a computer 4 which commands the operation of the system in the exposure of the work piece 2 by the electron beam. Computer 4 in one typical embodiment is a Hewlett Packard model HP21MX. Computer 4 connects over a conventional digital interface 5 to the data bus 6. The computer 4 is also connected in a conventional way to I/O devices such as a CRT console 69, a magnetic tape unit 70 and a magnetic disc unit 71. The computer 4 controls the remainder of the system.

The computer 4, through the digital interface 5, communicates with a number of addressable units connected to bus 6. Bus 6 is typically a 16-bit bus with appropriate conventional selection means (not shown) for selecting an addressed one of the units connected to bus 6.

In FIG. 1, the units connected to bus 6 include the memory 7, the X gain control 8, the Y gain control 8', the X rotation control 11, the Y rotation control 11', the X table control 10 and the Y table control 10'.

Memory 7 is a random access memory typically storing 2,048 or more 16-bit words. The X and Y gain controls 8 and 8' are typically digital-to-analog converters (DAC). When selected by the digital interface 5, the controls 8 and 8' convert the digital outputs to analog levels on lines 9 and 9', respectively. Lines 9 and 9' each connect as a reference (R) input to the X and Y deflection DAC's 32 and 32'. The DAC's 8 and 8' and the DAC's 11 and 11' are conventional devices of the type which typically receive a 10-bit input to responsively provide one of 1024 levels for the analog signal output. Such devices are conventional and in one typical embodiment are manufactured by Burr Brown with model number 60-10. Since those DAC devices do not have means for storing the digital signals from bus 6, each of the DAC's 8, 8', 11 and 11' are shown in FIG. 1 to include conventional registers 8-1, 8'-1, 11-1, and 11'-1 for storing the digital data, respectively, under command of the interface 5.

When exposing the work piece 2 to form a pattern thereon, it is important that the deflection gain of the electron beam be accurately controlled so that the actual size of the electron beam scan field on the work piece 2 corresponds to the desired size of the electron beam scan field. The gain controls 8 and 8' are utilized for controlling the size of the electron beam scan field. When the beam deflection exceeds or is less than required for the desired scan field size, the deflection gain signals from controls 8 and 8' are controlled to appropriately adjust the respective referenced inputs to the converters 32 and 32'.

The X and Y rotation controls 11 and 11' are digital-to-analog converters (DAC) of the same type as the converters for controls 8 and 8'. The controls 11 and 11' convert digital outputs from the computer 4 into an analog level on lines 13 and 13', respectively. Lines 13 and 13' are each connected to one of the inputs of the multiplying amplifiers 131 and 131', respectively. The other input to amplifier 131 is supplied from the output of the Y converter 32'. Similarly, the other input to the amplifier 131' is supplied from the output of the X converter 32. The amplifiers 131 and 131', respectively, provide output signals which are connected in common with and summed with the outputs of the X and Y deflection converters 32 and 32', respectively, in the sum circuits, 36 and 36', respectively.

In FIG. 1, it is desired that the scanning axes, X and Y, of the electron beam coincide with the axes X' and Y' of the table 24, and with the axes, X" and Y", of the work piece 2. The three sets of axes XY, X'Y' and X"Y" are shown with a common origin in FIG. 1. In order to bring the axes into common alignment, rotation of the electron beam axes XY is useful. The rotation controls 11 and 11' are utilized for adjustably rotating the axes XY of the electron beam relative to the axes X'Y' of the table and the axes X"Y" the work piece 2. In operation, digital signals specifying the degree of rotation are supplied from the computer 4 to the inputs of the rotation controls 11 and 11'. The outputs from control 11 and 11' in turn control the rotation by controlling the electron beam deflection through operation of the sum circuits 36 and 36' and the amplifiers 131 and 131'.

The rotation controls 11 and 11' are also utilized for controlling the perpendicularity of the electron beam scanning in response to the digital outputs from the computer 4. Perpendicularity of the electron beam scanning refers to the X axis movement relative to the Y axis movement.

In FIG. 1, the X and Y table controls 10 and 10' receive data from and connect data to the 16-bit bus 6. Controls 10 and 10' are shown in further detail in FIG. 2. Briefly, the control 10 receives a commanded position from the bus 6. The commanded positon from bus 6 is converted to the drive signal on line 16 for driving the X motor drive 18. The X motor drive 18 in turn drives the X motor 20 to position the X axis of the table 24 within the chamber 80. Similarly, the Y table control 10' via line 16' energizes the Y motor drive 18' which in turn energizes the Y motor 20'. The Y motor 20' drives the table 24 to the desired Y axis position. The motor drive 18 and 18' and the motors 20 and 20' are conventional devices for indexing a motor-driven table. A typical motor drive and motor employed in one preferred embodiment of the invention is manufactured by Torque Systems Inc. having model number RL 3260E. Such a system has a capacity of driving the table 24 at a rate of approximately 5 centimeters per second, and accelerating or decelerating at a rate of 10 meters/sec$^2$ (approximately 1G).

In addition to commanding the actual position of the table 24, the table control 10 and 10' also compare the commanded position (received over bus 6) with the actual position measured by the interferometer unit 81. The difference between the commanded position and the actual position is utilized to generate a correction signal on the 10-bit buses 14 and 14' for the controls 10 and 10', respectively. The 10-bit correction buses 14 and 14' are connected as inputs to the X and Y position correction DAC's 34 and 34'. The table 24 can be positioned by the motor drives 18 and 18' within an accuracy of about 0.24 micron from the commanded position. In order to provide higher accuracy as is necessary for scanning small areas, the converters 34 and 34' are utilized. The converters 34 and 34' form the analog correction signals IDX and IDY. The correction signals IDX and IDY are summed with the line scan signals IX and IY, respectively, in the sum circuits 36 and 36'. The line scan signals IX and IY are generated by the X and the Y deflection digital-to-analog converters (DAC) 32 and 32', respectively.

The converters 32 and 32' are of the same type as the converter 8 and 8'. Converters 32 and 32' are driven by inputs from the line generator 28 which is in turn driven by the line processor 26.

The line processor 26 is typically a conventional microprocessor such as the Motorola 6800. The line processor 26 accesses data for a line scan from the memory 7. Processor 26 then loads the line generator 28 with data sufficient for one line scan. The line generator 28 then is clocked at a high data rate loading the appropriate values into the converters 32 and 32' to perform a line scan at a high data rate. Converters 32 and 32' generate the line drive signals IX and IY in response to the outputs from line generator 28 as adjusted by the reference levels output from the gain controls 8 and 8'. Any correction factors required for drive signals IX and IY are derived from the converters 34 and 34' and the controls 11 and 11' which are all summed in the sum circuits 36 and 36'. The sum circuits 36 and 36' in turn drive the deflection unit 79 to actually position the electron beam.

The line generator 28 receives data from the line processor 26 via the 16-bit bus 57. Generator 28 in turn generates 10-bit deflection commands on output buses 53 and 53' which are connected to the X converter 32 and to the Y converter 32', respectively. Generator 28 also provides an output signal on line 52 which controls the blanking unit 78.

Line generator 28 provides a zero detect output line 51 which connects to the line processor 26. Zero detect line 51 signals the line processor 26 to indicate when the line generator 28 has completed a line scan. When generator 28 has completed a line scan, processor 26 immediately loads the generator 28 with a new line command and scanning continues in this manner.

The line generator 28 functions to inhibit line scanning whenever a STOP SCAN signal is drived on the lines 12 or 12' from the X and Y table controls 10 and 10'. The STOP SCAN signals signify that the commanded position of the table 24 relative to the actual position of table 24 exceeds a predetermined error (for example, greater than correctable by the 10-bit correction signal). Whenever this predetermined error is exceeded, the STOP SCAN signal functions to inhibit further operation of the line generator until the error is reduced to within the acceptable limits.

Table Control-FIG. 2

In FIG. 2, further details of the table controls 10 and 10' of FIG. 1 are shown. In FIG. 2, only the X table control 10 is actually shown since the Y table control 10' is identical.

In FIG. 2, the 16-bit bus 6 from the digital interface 5 is selectively gated to the commanded position register 42 and the maximum error register 48. The commanded position register 42 is a 24-bit register which receives the full 16-bits of bus 6 as one field and 8 bits of bus 6 as a second field. The lowest-order bit (and each count) in register 42 represents a distance of $0.08 \times 10^{-6}$ meter. The fields are separately addressed by the computer 4 of FIG. 1 and are separately selected at different times by the digital interface 5 in a conventional manner for computers. At still a different time, a 10-bit field of the 16-bit bus 6 is selected for the maximum error register 48. The lowest-order bit (and each count) in register 48 represents a distance of $0.08 \times 10^{-6}$ meter.

In FIG. 2, the actual position register 43 is a 24-bit register for receiving the actual position data from the 24-bit bus 38 from the interferometer unit 81 of FIG. 1. The lowest-order bit (and each count) in register 43 represents a distance of $0.08 \times 10^{-6}$ meter. The 24-bit outputs from the commanded position register 42 and the actual position register 43 are subtracted in a conventional 24-bit subtractor 44. The output from this subtractor is connected on a 24-bit bus to a 24-bit error register 45. The contents of the error register 45 are gated selectively to a number of locations in a number of field sizes. A low-order 16-bit and a high-order 8-bit field connect to the bus 6 for returning data through the digital interface 5 to the computer 4 of FIG. 1. The high-order 12 bits from error register 45 are input to the gate control 41. The low-order 12 bits from the register 45 are input to the error limit register 46. The low-order 10 bits connect to the magnitude comparator 49 and connects an output on bus 14 to a position correction DAC 34 in FIG. 1. The high-order 14 bits from register 45 connect to the control 41'.

Control 41, in one embodiment, is an EXCLUSIVE-OR gate network (not shown) for examining the 12 high-order bits from register 45. For positive errors less than $+4095$ ($2^{12}$-1), such network detects the all 0's condition of the 12 high-order bits. For positive errors greater than $+4095$, the network detects a 1 in any of the 12 high-order bit positions. In a similar manner, the network also detects for negative errors greater than or less than $-4096$ ($-2^{12}$).

If control 41 detects an error greater than $+4095$ ($2^{12}$-1) in register 45, it forces the error limit register 46 to the binary equivalent of $+4095$ producing the maximum negative velocity of the servo.

If control 41 detects an error less than $-4096$ ($-2^{12}$) in register 45, it forces the error limit register 46 to the binary equivalent $-4096$ producing the maximum positive velocity of the servo.

If the error is between the above two limits ($+4095$ and $-4096$), the error value in register 45 is fed directly to register 46 and then to converter 47 producing a servo motor velocity signal on line 16 proportional to the error value. This proportional velocity signal provides an overdamped drive response to the servo motor system while allowing it to accurately position the table 24 to an accuracy of less than one micron.

The contents of error register 45 and maximum error register 48 are fed to magnitude comparator 49. If the magnitude of the error exceeds the value in register 48, a STOP SCAN signal is provided to the line scan generator 28 of FIG. 1.

The 10 low order bits of register 45 also form the 10-bit bus 14 which forms the position correction signal for the position correction converter 44 of FIG. 1.

By way of summary, the table control of FIG. 2 includes a means for driving the table with a signal having a magnitude proportional to the difference between the commanded position and the actual position of the table, includes means for providing a position correction signal proportional to the difference between the commanded position and actual position of the table and provides a STOP SCAN signal whenever the difference between the commanded position and the actual position exceed a predetermined error.

Line Generator-FIG. 3

In FIG. 3, the line generator 28 of FIG. 1 is shown in greater detail. The line generator functions to provide signals to the deflection unit 79 for commanding the electron beam to scan a line at a time in discrete steps. The X location of the beam is stored in the X beam position up/down counter 60. The Y location of the beam is stored in the Y beam position up/down counter 60'. The number of steps to be scanned (in either the X or Y directions) is stored in counter 58. The lowest-order bit (and each count) in each of the counters 58, 60 and 60' represents a distance of $0.5 \times 10^{-6}$ meter. Scanning occurs for the number of steps represented by the count in length counter 58. Counter 58 and either the X counter 60 or Y counter 60' are incremented to cause the electron beam to be scanned. The 16-bit bus 57, from the processor 26 of FIG. 1, connects to the 10-bit length counter 58, to a 2-bit register (not shown) in the control unit 59, and to the 10-bit beam position counters 60 and 60'.

The line processor 26 supplies three 16-bit words to the line generator 28 when it receives a zero detection signal on line 51. Control unit 59 in FIG. 3 controls the distribution of the three words in the following manner. Upon receipt of the zero detection signal from detector 50, the control unit 59 is reset to parallel load the three low-order 10 bits of the first, second and third words from bus 57 into the X beam position counter 60, the Y beam position counter 60', and into the length counter 58, respectively, during first, second, and third stages of a load sequence. During the first stage, control unit 59 provides a control signal on line 61 to the X beam position counter 60 to cause counter 60 to parallel store the low-order 10 bits of data from bus 57 (which specifies a coordinate in the X axis of the beam).

After the counter 60 has received the first word, the control unit 59 sequences to the second stage and provides the control signal on line 62 to cause the Y beam position counter 60' to parallel store low-order 10 bits from bus 57 specifying a coordinate in the Y axis of the beam.

After receipt of the second word, the control unit 59 is stepped to the third stage. The control unit 59 provides the control signal on line 63 to cause the counter 58 to parallel store the low-order 10 bits of the third word from bus 57. Control unit 59 also on the third stage stores the two high-order bits of the third word. The two high-order bits, BIT 14 and 15, designate the direction of scan (positive or negative) and the axis of scan (X or Y).

Upon the receipt of the two high-order bits, the control unit 59 is stepped to the operating stage removing the beam blanking signal on line 52 and enabling the clock signal to counter 58. The control unit 59 then steps the counter 58 at the clock rate (for example, $10^7$Hz or greater) until the length counter 58 is counted down to zero.

Meanwhile, the control unit 59 provides the control signals on lines 64 and 65. The control signal on line 64 causes one of the counters 60 and 60' to step up or down in accordance with the BIT 14. The other control signal, on line 65, causes the counter 58 to provide a signal generated at each step thereof to the X or Y beam counter 60 or 60', whichever one corresponds to the scan axis, as determined by the BIT 15. If BIT 15 is a logical 1, then the counter 60 is counted by the signal on line 66 from the counter 58 while counter 60' is not counted. If BIT 15 is a logical 0, the the counter 60' is counted by the signal on line 66' while counter 60 is not counted. The 10-bit outputs on lines 53 and 53' from counters 60 and 60' connect to converters 32 and 32'.

When the length counter 58 is counted down to zero, the zero detector 50 senses a zero, resets the control unit 59 to the beginning of the sequencing stage and signals the processor 26 to send a sequence of three additional words.

If at any time during the scanning mode either of the STOP SCAN lines 12 or 12' signals to stop the scanning, the control unit 59 inhibits clock outputs and generates the BEAM BLANK signal until neither STOP SCAN signal is present.

Field Scan - FIG. 4

In FIG. 4, the scan field 102 produced by the electron beam column 76 of FIG. 1 is shown in greater detail. The scan field 102 covers an area 512 by 512 microns (512 × $10^{-6}$ meters square). That area is divided into 1,048,576 addressable locations where each location appears at the intersection of one of 1,024 rows and one of 1,024 columns. The columns are defined by the 10-bit X address and the rows are defined by the 10-bit Y address previously described in connection with the line generator of FIG. 3. The line generator of FIG. 3 causes the electron beam to be deflected so as to be incident at any one of the 1,048,576 locations specified by a row address and a column address.

In a typical embodiment, the electron beam spot size is 0.5 micron in diameter. With this spot size for the electron beam and with the 1,024 addresses per axis, the entire 512 by 512 micron scan field or any part thereof, may be exposed by the electron beam.

In connection with FIG. 4, an example of how the present invention operates to scan a particular part of a circuit is described. In FIG. 4, the scan field 102 includes in the lower left hand corner a printed circuit conductor 103 which terminates in a printed circuit land 104. The conductor 103 is 3 microns wide, has a right angle and terminates in a land 104 which is 5 microns square. Assumming, for purposes of explanation, that the scanning of the conductor 103 and land 104 is to occur in the X direction, then the following addresses are generated by the line generator of FIG. 3.

In the manner previously indicated in conjunction with FIG. 3, the X beam position counter 60 is loaded with a 10-bit binary word which specifies column 5.

Thereafter, the Y beam position counter 60' is loaded with another 10-bit binary word which specifies row 3. The outputs of the counters 60 and 60' are fed to the X deflection DAC 32 and the Y deflection DAC 32', to cause the electron beam to be positioned at the point of column 5 and row 3.

Meanwhile, the length counter 58 is loaded with still another 10-bit word representing the distance to the last location of the conductor 103 in row 3, which is column 20. At the same time, the control unit 59 receives BIT 14 as a logical 1 and BIT 15 as a logical 1, which together, indicate that the scanning is to occur in the positive X direction. After the loading has been completed, the beam blanking signal on line 52 is removed and the X axis address in the X beam position counter 60 is incremented until the length counter 58 reaches a zero count. Incrementing occurs because BIT 14 and BIT 15 are logical 1's. When the count in length counter 58 reaches zero, the beam blank signal is turned on and no further exposure in row 3 will occur. The zero detector 50 causes the control unit 59 to load three new 10-bit numbers for the next scanning line. An identical 10-bit number indicating column 20 is stored in the X beam position counter 60, and the Y beam position counter 60' is loaded with a 10-bit number which indicates row 4. Then, the X and Y DAC's 32 and 32' supply analog signals to position the beam at the column 20 and row 4 location.

A length count of 15 is loaded into counter 58 and the control unit 59 detects BIT 14 as a logical 0 and BIT 15 as a logical 1.

Therefore, the X beam position counter is decremented and the beam is moved in the negative X direction while scanning the row until the length counter reaches a zero count. Scanning in this manner for each row for columns 5 through 20 continues.

After the scanning has been performed for row 8, new numbers specifying column 15 and row 9 are stored respectively into the X beam position counter 60 and the Y beam position counter 60', and then the length counter 58 is loaded with a length count of 6. Scanning with this length count of 6 is carried out for each of the rows 9 through 14, while the initial count in the counter 60 is changed to 15 for rows 9, 11 and 13 and to 20 for rows 10, 12 and 14 and the count in the Y counter 60' is incremented by one for each row from 9 to 14.

Thereafter, the scanning for the land 104 is started by entering the Y address for row 15 into the Y beam position counter 60' and the X address for column 13 into the X beam position counter 60. The length count is 10 and is loaded into the length counter 58. Each of the rows 15 through 24 is scanned with a length of 10 in order to complete scanning of the land 104.

All of the scanning of the conductor 103 and land 104 in FIG. 4 occurs without any requirement that the table 24 of FIG. 1 be moved.

It should be observed that the data rate for scanning the pattern comprising the conductor 103 and the land 104 is determined by the bit rate of data from the counters 58, 60 and 60'. That bit rate is defined by the clock rate at which the counters 58, 60 and 60' are stepped. In the present invention, time is not wasted scanning areas of the scan field 102 which are not to be exposed by the electron beam. While the data bit rate of scanning is the rate of clocking counters 58 and 60, the data rate for loading three words into the line generator 28 is also important in maintaining a high data rate because three words must be accessed for each line to be scanned by the line generator 28. On the other hand, the data rate between the line processor 26 and the computer 4 need only be at a rate great enough to exceed the line rate of scanning. For example, a data rate of $10^6$ words per second between computer 4 and processor 6 (on a non-continuous burst mode basis) normally sustains a $10^8$ bit per second data rate between line generator 28 and column 76.

Table Position — FIG. 5

In FIG. 5, the table 24 and work piece 2 of FIG. 1 are shown in greater detail. The work piece 2 is typically a semiconductor wafer of approximately 100 millimeters in diameter. The wafer 2 has a center indicated by the intersection of the X' and Y' axes. The electron beam from electron beam column 76 of FIG. 1 is incident upon the wafer 2 at a location indicated by the intersection of the X and Y axes. The table 24 and wafer 2 are relatively movable with respect to the incident electron beam. Therefore, the X' Y' axes are relatively movable with respect to the XY axes through movement of the table 24. In FIG. 5, the point of incidence (intersection of X and Y) of the electron beam is shown in the lower left quadrant of the X' Y' axes. In FIG. 5, the area of incidence of the electron beam is at one row and one column address within a scan field of the FIG. 4 type. That scan field is in turn within one of many chip areas. The particular chip area 101-1 over which the scan field of the electron beam is incident is determined by the position of the table 24 as defined by axes X' Y'. The chip areas 101 are areas which can be ultimately diced and then packaged to form individual integrated circuits. A chip area can be and typically is larger than the scan field of the electron beam. Therefore, each chip area is divided into partitions which can be individually exposed by the beam scan field. The table 24 and wafer 2 are moved to superimpose the beam scan field over a selected chip area and over a selected partition within a chip area.

In FIG. 5, the electron beam axes X' Y' is located to position the electron beam scan field over a chip area 101-1. The scale of FIG. 5 does not allow the partitions of the chip area 101-1 to be observed.

In one application of the present invention, the beam scan field 102 as shown in FIGS. 4 and 6, is typically 512 by 512 microns and the chip area 105, as shown in FIG. 7, is typically 1350 by 1606 microns. Since the scan field 102 is smaller than the chip area 105, the chip area 105 is divided into twelve partitions 106. Each partition 106 is smaller than the scan field 102. Each partition is positioned, at a different time, to be superimposed by the electron beam scan field so that twelve different positions of the table 24 and wafer 2 are needed to permit one chip area 105 to be fully scanned by the electron beam.

In FIG. 5, the electron beam scan field is positioned over the chip area 101-1. Wafer 2 will accomodate hundreds of other chip areas of the same size, some of which are represented by chip areas 101 in FIG. 5. The table 24 is positionable to locate any chip area 101 (and any partition of a chip area) beneath the electron beam scan field.

Chip Area Formation By Overlapping Scan Fields — FIGS. 6 & 7

In FIG. 6, a scale representation of the electron scan field 102 like that previously described in FIG. 4 is shown.

In FIG. 7, a chip area 105 is shown having the dimensions of 1,606 microns by 1,350 microns. The chip area 105 is further divided into the partitions 106 and specifically the twelve partitions 106-1, 106-2, . . . , 106-12. The partitions are each smaller than the scan field 102 of FIG. 6. For example, the partitions are 450 microns by 401.5 microns in a typical example. Note that each of the partitions 106 of FIG. 7 can be totally enclosed within the scan field 102 shown to the same scale in FIG. 6.

In FIG. 7, the scan field 102 of FIG. 6 is shown positioned relative to the partition 106-7. When so positioned, the scan field 102 is designated as scan field 102-7. The scan field 102-7 is designated by long broken lines in FIG. 7. Also in FIG. 7, the scan field 102 is shown positioned over the partition 106-8 and the scan field is shown as short broken lines and is designated as scan field 102-8. The boundary line 120 (7/8) between partitions 106-7 and 106-8 is covered both by the scan field 102-7 and the scan field 102-8. There is a region 122 having a dimension B2 which is common to both the scan field 102-7 and the scan field 102-8. In accordance with the present invention, electron beam scanning within the region 122 can be performed either in connection with the scan field 102-7 or in connection with the scan field 102-8. While only the partitions 102-7 and 102-8 have been indicated showing the overlapping scan field relationship, each of the partitions in FIG. 7 and the adjacent partitions on any side similarly have an overlapping boundary relationship relative to the electron beam scan fields.

The purpose of this overlapping boundary relationship is to permit portions of the chip pattern which lie within the overlapping boundary region, such as region 122, to be selectively processed either in one scan field (eg. 102-7) or in the other scan field (102-8). This selective scanning in one or the other of the posssible scan fields avoids the necessity of scanning patterns within the boundary using two different scan fields. It has been found that when patterns having critical dimensions are scanned by two different scan fields, that is, partially in one scan field and partially in another scan field, substantial errors are frequently introduced.

In accordance with the present invention, such errors can be reduced or eliminated by wholly scanning critical dimensions in the boundary region using only one of the two possible scan fields.

In FIG. 7, if the width of the partition, W7, is 401.5 microns and the scan field 102-7 is 512 microns, the portion of the boundary B1 is 55.5 microns and the full boundary region demension B2 is 110.5 microns. In a similar manner, a portion of the boundary region having dimension B3 lies between partitions 106-7 and 106-5 and measures 31 microns. The full boundary between scan field 102-6 (not shown) and the scan field 102-7 is then 62 microns wide.

Chip Pattern — FIG. 8

In FIG. 8, a chip area 105 is shown including a chip pattern 107. The chip pattern 107 is to be exposed with an electron beam in accordance with the present invention. The pattern includes a number of pads 131 which are identified as P1, P2, . . . , P24. The pads are generally arranged around the perimeter of the chip area 105. The pads 131 are utilized, for example, to form off-chip connections in a final package integrated circuit (not shown). The pads 131 and other areas on the chip area 105 include various lines 132. In FIG. 8, the lines all represent conductors in one layer of a multi-layer semiconductor structure. The present invention, of course, also pertains to other layers in which the chip patterns represent semiconductor regions and other circuit elements well known in the field of integrated circuits.

The chip pattern 107 is layed out for convenience in connection with an X axis and a Y axis which intersect at an origin 130. Each line 132 and each pad 131 in the circuit pattern 107 is initially specified in accordance with its position and size relative to the origin 130. Furthermore, each portion of the chip pattern 107 is formed by one or more different sized shapes. While many different shapes can be employed, the particular example of FIG. 8 employs rectangular shapes. Each rectangular shape, is designated by four numbers which represent its displacement along the X axis from the origin 130, its displacement along the Y axis from the origin 130, its length along the X axis, and its length along the Y axis. These four numbers are designated as four words, namely, WORD 1, WORD 2, WORD 3, and WORD 4, respectively. The words are conveniently stored and processed in the data processing apparatus of FIG. 1.

By way of example, and referring to FIG. 8, the P12 pad 131 is a rectangle which measures 120 microns by 120 microns or 240 by 240 one-half microns. In FIG. 8, the coordinate system is measured in one-half microns (because the electron beam spot diameter is one-half micron wide). Therefore, as indicated in FIG. 8, the dimensions of the P12 pad 131 are 240 by 240 one-half microns.

The displacement of the P12 pad 131 from the origin 130 is 1,280 one-half microns along the X axis and −1,120 one-half microns along the Y axis. Hence the displacement address from origin 130 is designated as [1,280, −1,120]. The displacement address designates the location of the lower left-hand corner of the P12 pad 131. The P12 pad 131 has a length along the X axis of 240 one-half microns and a length along the Y axis of 240 one-half microns.

In accordance with the four word notation, the WORD 1, WORD 2, WORD 3 and WORD 4 designations which specify the rectangular shape for the P12 pad 131 are 1,280, −1,120, 240, 240, respectively.

The P12 pad 131 has a rectangle 133 adjacent to its left-hand edge. The WORD 1, WORD 2, WORD 3 and WORD 4 designations for the rectangle 133 are 1,260, −1,040, 20 and 80.

In a similar manner, the P11 pad 131 has the WORD 1 through WORD 4 designations 1,280, −720, 240, 240, respectively.

In FIG. 8, every portion of the chip pattern 107 is specified in terms of its rectangular dimensions and its offset position from the origin 130. A file listing for the entire chip pattern 107 of FIG. 8 appears as TABLE I at the end of this specification. Referring to TABLE I, the record number (RECORD NO.) column identifies each 4-word record. As previously explained, WORD 1 designates the X axis offset from the origin 130. WORD 2 designates the Y axis offset from the origin 130. WORD 3 designates the length, XL, of the rectangle along the X axis. WORD 4 designates the length, YL, of the rectangle along the Y axis. Certain of the records of TABLE I designate header information to identify TABLE I.

Specifically, referring to record numbers 1 and 2 the four words merely indicate information identifying TABLE I and its use in connection with other integrated circuit layers.

Record number 3 is a header which indicates in WORD 1 and WORD 2 that the size of the chip area is 1,606 microns in the X axis and 1,350 microns in the Y axis. WORD 4 indicates that the remainder of TABLE I is comprised of 681 record numbers, that is, record numbers 4 through 684.

Record number 4 specifies the four words which define the P12 pad 131 as previously described.

Record number 5 specifies rectangle 133 in the manner previously described.

Record number 6 describes the P11 pad 131 in the manner previously described.

Additionally, record numbers 8, 10, 12, . . . , 24, 26, 28, 30, . . . , 48, 50, designate the pads P10, P9, P8, . . . , P2, P1, P24, P23, . . . , P14, P13, respectively. In a similar manner, every other rectangular shape on the chip pattern within chip area 105 is defined by a four word record entry in TABLE I.

By way of further example, still referring to FIG. 8 and TABLE I, record number 331 specifies the land (for a via hole) V2. Record 333 specifies the land V1. Record 374 specifies the land V3 and record 375 specifies the land V4. Record 377 specifies the line L1, record 426 specifies the line L3, record 430 specifies the line L4 and record 441 specifies the line L2. The lines L1 through L4 and the via holes V1 through V4 lie in the general vicinity of a partition line 120(7/8) which has been drawn to partition the chip pattern on the chip area 105 of FIG. 8. It should be noted, however, that the input file of TABLE I has entries with respect to the origin 130 without regard to any partitioning of the chip area 105.

The chip pattern of FIG. 8 is divided into 12 partitions 106-1 through 106-12 in the manner described previously in connection with FIG. 7. Accordingly, the data of the unpartitioned file of TABLE I must be processed to partition the data so that it corresponds with the partitions 106-1 through 106-12 of FIG. 8. Actually, the partitions 106-11 and 106-12 do not contain any of the chip pattern and hence only 10 partitions need be employed to define the chip pattern of the chip area 105 in FIG. 8.

Referring to FIG. 8, the partitioning of the chip pattern 107 requires that portion of the chip pattern in each of the partitions 106 to have its data in TABLE I translated relative to the XY axes having an origin 130 to a new coordinate system having an origin in the lower lefthand corner of the scan field 102 associated with the particular partition 106. Referring to FIG. 7, the origin 130 is shifted to a point 134-7 in connection with the partition 106-7. The point 134-7 is the lower left-hand corner of the scan field 102-7.

Referring to FIG. 8, the partitions 106-1 has a translated coordinate system including the X1 axis and the Y1 axis which intersect at the origin 134-1. The origin 134-1 is 1412 one-half microns shifted down from the X axis and 1716 one-half microns shifted over from the Y axis. The 1412 one-half micron value is determined in the following manner. The shift from the X axis is equal to one-half the height of partition 106-5 (equal to 450 one-half microns), the total height of the partition 106-1 (900 one-half microns) plus the width of the boundary of the partition 106-1 and the scan field 102-1 (62 one-half microns). Similarly the 1,716 number is equal to the width of the partitions 106-1 and 106-2 (each 803 one-half microns) plus the width of the boundary between the scan field 102-1 and the partition 106-1 (110 one-half microns). All of the chip pattern rectangular shapes of FIG. 8 which fall within the partition 106-1 may have their coordinates translated to the new axis by adding 1,716 to the X axis coordinate and by adding 1,412 to the Y axis coordinate. In general, this translation involves searching all of the records in the TABLE I file to ascertain which ones fall within the scan field associated with the partition 106-1 of FIG. 8. Thereafter the X axis and Y axis translation factors are added to form the translated coordinates. Such a translation for all the rectangular shapes and all the partitions of FIG. 8 are shown in TABLE II.

Referring to TABLE II, record numbers 1 and 2 merely specify information identifying the table and its use in forming an integrated circuit. WORD 2 of record number 2 indicates that TABLE II comprises the following 733 record numbers, namely, record numbers 3 through 735.

Record number 3 indicates that the table specifies a chip pattern which measures 1,606 by 1,350 microns.

Record number 4 indicates the number of one-half microns that the table 24 of FIG. 1 must be moved from the origin 130 in order to superimpose the scan field 102 of the electron beam over the partition 106. The table is moved −1,204 one-half microns in the X direction and −900 one-half microns in the Y direction so that the scan field has its translated center at 130-1 and has its lower left-hand corner at point 134-1 as shown in FIG. 8.

Record number 5 of TABLE II indicates that the partition 106-1 has a width in the X direction of 803 one-half microns and in the Y direction of 900 one-half microns. WORD 4 of record number 5 indicates that the partition 106-1 is defined by 8 rectangles. Those 8 rectangles are specified in the following 8 record numbers, namely 6 through 13.

Record number 6 defines the P20 pad 131 with respect to the X1 Y1 coordinate system. Record number 6 indicates that the lower left-hand corner of the P20 pad 131 has a location which is 196 one-half microns along the X axis and 692 one-half microns along the Y1 axis all with respect to the origin 131-1. The WORD 3 and WORD 4 entries of TABLE II are identical to the WORD 3 and WORD 4 entries of TABLE I since no change in the size of the rectangle has been implemented with respect to the translation presently described. Of course, if a change in scale were desired, the WORD 3 and WORD 4 entries could be also translated to changed values.

Record number 6 in TABLE II corresponds to record number 36 in TABLE I. The TABLE II entry of 196 is obtained by adding 1,716 to −1,520. The 692 TABLE II entry is obtained by adding 1,412 to −720 in the manner previously described.

In TABLE II, the records 8 and 10 specify the P19 and P18 pads 131. The records 8 and 10 of TABLE II correspond to the records 38 and 40 of TABLE I.

In TABLE II, record 14 specifies the amount that the table 24 of FIG. 1 must be moved from its position at partition 106-1 in order to position the scan field 102 over the partition 106-2. The move is 803 one-half microns in the positive X direction and no movement in the Y direction.

Record 14 specifies the size of the partition 106-2, namely 803 by 900 one-half microns. WORD 4 specifies the number of record entries and hence the number of rectangular shapes which form the pattern within the partition 106-2. The number of rectangular shapes is 9 and includes records 16 through 24.

In TABLE II, record 25 indicates the 803 one-half microns required to move the scan field from its position at partition 106-2 to superposition it over the partition 106-3. Record 26 indicates the 803 by 900 one-half micron size and that 139 rectangular shapes are employed to define the chip pattern within the partition.

The 139 shapes are defined in the records 27 through 165.

In TABLE II, record 166 specifies an 803 one-half micron move from its position at partition 106-3 to superposition the scan field 102 over the partition 106-4 of FIG. 8.

Record number 167 indicates the partition size and that 112 record numbers are employed to define the chip pattern within the partition 106-4. Those 112 record numbers are 168 through 279.

Record number 280 specifies the zero X axis and 900 Y axis movement of the table 24 of FIG. 1 from its position at partition 106-4 to superimpose the scan field 102 over the partition 106-5 of FIG. 8.

Record number 281 indicates the size of the partition and that six record numbers are employed to define the partition. The record numbers are 282 through 287.

Record number 288 specifies the −2,409 one-half micron X axis move of the table 24 of FIG. 1 from its position at partition 106-5 to superimpose the scan field 102 over the partition 106-6 of FIG. 8.

Record number 289 specifies the size of the partition and that six records comprising record numbers 290 through 295 that define the chip pattern.

Record number 296 specifies the movement of the table 24 from its position at partition 106-6 to superimpose the scan field 102 over the partition 106-7 of FIG. 8. Record number 297 indicates the 109 record numbers running from record number 298 through record number 406 which define the chip pattern within the partition. The L1, L2, 3, V1, V3, and V4 shapes in FIG. 8 are defined in TABLE II by record numbers 367, 402, 393, 342, 364, 365, respectively, and the corresponding record numbers in TABLE I are 377, 441, 426, 333, 374, 375, respectively. These record numbers will be utilized hereinafter in accordance with the double boundary partitioning of the present invention since they define shapes which fall on the partition boundary 120 (7/8) between partition 106-7 and partition 106-8.

In TABLE II, record number 407 specifies the 803 one-half micron move of table 24 from its position at partition 106-7 in order to superimpose the scan field 102 over the partition 106-8 of FIG. 8.

Record number 408 among other things specifies that the chip pattern within the partition 106-8 includes 190 records which run from record number 409 to record number 598.

In connection with partition 106-8, the patterns L2, L3, V1, V3 and V4 do not find a record entry even though part of those patterns appear in partition 106-8. The reason they do not appear in the records for partition 106-8 is because, in accordance with the present invention, the entire designation for those patterns appears in the record for partition 106-7. Note in connection with the record for partition 106-8 that a portion of the pattern L3 is stored in record 592 and the entire pattern for V2 is stored in record 549.

Record number 599 of TABLE II indicates the 803 one-half micron X axis movement of the table 24 required from its position at partition 106-8 to superimpose the scan field 102 over the partition 106-9 of FIG. 8.

Record number 600 indicates that 117 record numbers, which appear as record numbers 601 through 717 are required to designate the chip pattern falling within the partition.

Record number 718 of TABLE II specifies the 803 one-half micron movement required from the position at partition 106-9 to superimpose the scan field 102 over the partition 106-10 of FIG. 8. Record number 719 indicates that 14 records, appearing in record numbers 720 through 724, are required to designate the chip pattern falling within the partition 106-10.

Record number 734 designates a move to return the scan field to the origin 130 and record number 735 indicates the end of the TABLE II listing.

Partition Boundary—FIG. 9

In FIG. 9, an expanded view of the chip pattern in the partitions 106-7 and 106-8 in the vicinity of the partition boundary 120(7/8) is shown. In FIG. 9, the lines which cross the partition boundary 120(7/8) are designated as L1, L2, ..., L8. Similarly, the land patterns which cross the boundary 120(7/8) are designated as V1, V2, ..., V6. If the patterns L1 thorugh L8 and V1 through V6 were scanned directly, then a portion of each would be exposed by an electron beam in connection with the partition 106-7 and also a portion in connection with the partition 106-8. For example, line L1 would be exposed four-fifths in connection with partition 106-7 and one-fifth in connection with partition 106-8. Any error in the movement of the table 24 of FIG. 1 in positioning the scan field 102 in connection with the partition 106-7 relative to the partition 106-8 would tend to alter the dimensions of the line L1. Line L1 is, in the particular example, intended to be 5 microns wide. An unwanted change in the relative position of the scan fields would tend to either divide the line L1 into two lines or to reduce the dimensions of the line. Errors of this type, particularly when the chip pattern being formed are critical dimensions, such as regions of transitors or other semiconductor devices, tend to introduce significant errors. In accordance with the present invention, this problem is avoided at scan boundary regions by selectively including shapes having critical dimensions all within one partition or all within another partition. For example, the line L1 in FIG. 9 is totally exposed in connection with the processing of the partition 106-7 and is not exposed at all in connection with the scanning of the partition 106-8. Further details of the scanning at the partition boundary are described in connection with FIGS. 10 and 11.

Double Boundary Partitioning—FIGS. 10 & 11

In FIG. 10, the portion of the chip pattern 107 scanned within the scan field 102-7 in connection with the partition 106-7 is shown. A detailed listing of the rectangles which comprise the chip pattern of FIG. 10 appears in TABLE II in record numbers 297 through 406. In a similar manner, FIG. 11 depicts that portion of the chip pattern 107 which is scanned within the scan field 102-8 in connection with the partition 106-8. For convenience, the partition line 120(7/8) in FIG. 8 has been separated in FIGS. 10 and 11 and appears therein as lines 120(7) and 120(8), respectively. In the actual scanning, however, the lines 120(7) and 120(8) are superimposed and form only one common boundary line 120(7/8) as shown in FIG. 8.

Referring to the boundary 120(7) in FIG. 10, it can be noted that the patterns V5, V3, L1, V4, L2, V1, L7, and V6 all extend across the boundary 120(7) into the region between the boundary 120(7) and the outer perimeter of the scan field 102-7. Because the area of the scan field 102-7 intentionally is greater than the area of the partition 106-7, the extension into the boundary region of the portions of the pattern along the boundary 120(7) is readily facilitated in accordance with the present invention.

Referring to FIG. 11 by way of contrast, no portion of the chip patterns V5, V3, L1, V4, L2, V1, L7, and V6 appear in FIG. 11 since all portions of those chip patterns are included in FIG. 10.

Chip Pattern Partitioning

The decision of where to position shapes (rectangles) falling on the boundary or in more than one partition area can be made manually by inspection of FIGS. 8 and 9. Since the coordinates of all the rectangles are available in TABLE I, the partitioning can be performed automatically with greater speed using data processing equipment.

One preferred method of partitioning a chip pattern using data processing techniques will now be described.

It is assumed that the TABLE I data is stored in the data processing system and it is identified as the unpartitioned file. A decision is made as to how many partitions into which the pattern represented by the TABLE I file is to be divided. In accordance with the present example, 12 different partitions, of which only 10 contain any information, are to be formed.

The partitions, as can be seen in connection with FIG. 12, are arrayed in rows and columns. The first column, designated as 01, includes the partitions 106-1, 106-6 and 106-7. The second column, designated as 0, includes the partitions 106-2, 106-11 and 106-8. The next column, designated as +1, includes the partitions 106-3, 106-12 and 106-9. The final column, designated as +2, includes the partitions 106-4, 106-5 and 106-10.

In a similar manner, the rows of partitions can be observed with respect to FIG. 12. The row designated as 0 includes the partitions 106-1, 106-2, 106-3 and 106-4. The row designated as +1 includes the partitions 106-6, 106-11, 106-12 and 106-5. The row designated as +2 includes the partitions 106-7, 106-8, 106-9 and 106-10.

In TABLE I, record numbers 1 and 2 are accessed from the unpartitioned file and stored in record number 1 and 2 locations of the partitioned file which is TABLE II. This information merely serves to identify the pattern. The TABLE I information only represents one pattern layer while any given circuit design typically has a number of layers. Each layer, however, is similar to the layer represented in TABLE I and would be processed in the manner now to be described for TABLE I.

Initially, the first shape (the rectangle of record number 4) is accessed from the unpartitioned file. After the first shape is processed, then the second shape (record number 5) is accessed and processed in the manner not to be described until all shapes, 681 in all for TABLE I, have been processed.

Record number 4 as accessed from TABLE I has coordinates established with respect to the origin 130 (see FIG. 8). The first step is to shift the origin to a new origin 130' which is on both an X and Y partition boundary. The shift is carried out by adding −450 one-half microns to the Y coordinate of record number 4. No X axis addition is required since origin 130 is already on an X axis partition boundary.

The next step in the process of dividing the whole pattern of FIG. 8 into twelve partitions is to determine the partitions that the shape currently being processed falls into. The process for each shape first examines the coordinates in the X direction to determine the first and last partition columns which the shape falls into. This determination is carried out initially for the X axis by executing the subroutine of CHART I.

The details of the steps in CHART I will be explained hereinafter in connection with the examples of FIG. 12. Briefly, however, each shape is analyzed in the X direction for determination of whether or not the shape has any portions in each of the columns, starting with the FIRST and going to the LAST column. The partitioning is done by using a four-word quantity defined as the RESIDUAL COLUMN SHAPE. Initially, the RESIDUAL COLUMN SHAPE includes the entire shape as defined by the four words (WORD 1, ..., WORD 4) from the TABLE I record. When the partitioning of the FIRST column occurs, the portion of the shape within the FIRST column (again designated by four words) is placed in a local storage area with a column identification code appended. The portion placed in the local storage area is designated as the COLUMN SHAPE and it is subtracted from the RESIDUAL COLUMN SHAPE. Thereafter, the COLUMN SHAPE for the next column after the FIRST is stored in a local storage area with appropriate column identification, and the COLUMN SHAPE thus stored is subtracted from the RESIDUAL COLUMN SHAPE. Processing continues in this manner for each column until the LAST column is reached. When the LAST column is reached, the balance of the RESIDUAL COLUMN SHAPE is stored in the local storage area with appropriate identification of the LAST column. Under certain conditions, of course, as discussed in connection with CHART I, the FIRST column is equal to the LAST column and the particular shape is entirely within a single column.

After all of the COLUMN SHAPES have been stored in local storage (four words each) with appropriate identification of the column, each COLUMN SHAPE is then further processed along the Y axis to determine the portion, called the ROW/COL SHAPE, of each COLUMN SHAPE which is located in each row.

In scanning in the Y direction, the steps of CHART I are again repeated for each COLUMN SHAPE in local storage. In accordance with that CHART I, the FIRST and LAST rows are determined for a first one of the COLUMN SHAPES. Each stored COLUMN SHAPE initially forms one RESIDUAL ROW/COL SHAPE. This RESIDUAL ROW/COL SHAPE is then processed from the FIRST to the LAST row. As each row is processed, a ROW/COL SHAPE is formed and is subtracted from the RESIDUAL ROW/COL SHAPE. The ROW/COL SHAPE thus formed is stored in local storage with appropriate row identification appended to the column identification. Each ROW/COL SHAPE thus formed has, therefore, an appropriate row and column identification which uniquely defines one of the partitions into which the ROW/COL SHAPE is to be placed.

With the ROW/COL SHAPE thus having a unique one of the partitions identified, it now becomes a task of translating the coordinates for the X and Y origins of that ROW/COL SHAPE to appropriate values associated with an origin of the identical portion. The X and Y coordinates currently stored in WORD 1 and WORD 2 are with respect to the origin 130'. The coordinates for the lower left hand corner of the partition to which the portion of the shape is to be assigned are subtracted from the WORD 1 and WORD 2 values of the ROW/COL SHAPE in local storage. The new WORD 1 and WORD 2 result is a shift of the origin from 130' to the lower left hand corner of the identified partition. Next, the X and Y offset values (OFST in CHART I) are added to the new WORD values. In the present example, the X axis offset added is 111 one-half microns and the Y axis offset added is 31 one-half microns. The result of adding the offset values translates the origin from the lower left hand corner of the identified partition to the lower left hand corner of the scan field associated with that partition.

When all of the rows have been thus processed for a particular COLUMN SHAPE, then the processing is again repeated for the next COLUMN SHAPE in turn storing each new ROW/COL SHAPE with a row and column identification and translated coordinates. Finally, when all of the COLUMN SHAPES have been thus processed, processing for a single one of the TABLE record number shapes is complete and the system is now ready to repeat the process all over again for the next record number shape. In the example of TABLE I, the first shape is record number 4 and is the next shape is record number 5. When the processing for record number 5 is complete, the processing continues for each of the shapes of record numbers 6 through 685 of TABLE I.

After all of the shapes of TABLE I have been processed and stored in a local store with appropriate row and column identifications, the ROW/COL SHAPES are then sorted by partition and listed in the partitioned file which appears as TABLE II.

Further details of CHART I will not be explained. CHART I is essentailly a FORTRAN subroutine which is executed a multiple number of times for each shape. The subroutine automatically allocates portions of shapes to positions including those portions lying in the overlapping boundary regions between adjacent scan areas.

CHART I

```
S1         SUBROUTINE PBND (FIRST, LAST, OFST, PLEN, ORGN, LEN)
S2         INTEGER FIRST, LAST, PLEN, ORGN, LEN, OVER, UNDER, OFST
S3      C
S4      C  THIS ROUTINE DETERMINES THE SPREAD OF FIELDS A
S5      C  RECTANGLE MAY COVER. ONE AXIS AT A TIME
S6      C
S7         FIRST=ORGN/PLEN+1
S8         IF(ORGIN.LT.0)FIRST=(ORGN+1)/PLEN
S9         NXT=ORGN+LEN
S10        LAST=NXT/PLEN+1
S11        IF(NXT.LT.0)LAST=(NXT+1)/PLEN
S12        UNDER=FIRST*PLEN−ORGN
S13        OVER=NXT−PLEN*(LAST−1)
S14     C
S15     C  CHECK FOR POSSIBLE EXTENDED FIELD COVERAGE TO
S16     C  MINIMIZE THE NUMBER OF FIELDS THIS RECTANGLE MUST
S17     C  COVER
S18        IF(FIRST.EQ.LAST)GO TO 30
S19        IF(UNDER.LT.OFST)FIRST=FIRST+1
S20        IF(OVER.LT.OFST)LAST=LAST−1
S21        IF(FIRST.LE.LAST)GO TO 30
S22        IF(OVER−UNDER)10,10,20
S23     10 FIRST=LAST
S24        GO TO 30
S25     20 LAST=FIRST
S26     30 RETURN
S27        END
```

In CHART I, statement S1, the subroutine is named as partition boundary (PBND) and the input values for the variables indicated, FIRST, LAST, OFST, PLEN, ORGN, and LEN are called for. FIRST and LAST are initially 0. OFST is the value of the offset which is equal to the width of the boundary region, B2 in FIG. 7, between the partition boundary line 120 and the scan field perimeter 102. In the particular example of FIG. 8, OFST is equal to 110 one-half microns for X axis scans or 31 one-half microns for Y axis scans. The quantity PLEN is equal to the partition width which, in the example of FIG. 8 is 803 one-half microns for X axis scans or 900 one-half microns for Y axis scans.

The quantity ORGN designates the origin of each particular shape with respect to the axis of scan, either X or Y. The quantity LEN is equal to the length of each particular shape in the direction of scan.

Statement S2 incidates that the values of statement S1 are integers. The quantity OVER designates the length that a shape extends from the partition boundary line in the partition in which the shape terminates. The quantity UNDER designates the length between the beginning of the shape and the first partition boundary line.

Statement S3 through S6 are reserved for a textual comment which help explain CHART I.

In Statement S7, the quantity FIRST is calculated from given values of ORGN and PLEN. Referring to FIG. 12, an example of the S7 calculation is described in connection with the X axis scan of rectangular shape 141. In FIG. 12, the partitions running along the X axis are 106-1, 106-2, 106-3 and 106-4 in connection with the Y coordinate in the vicinity of the shape 141. The partition boundary line 122/3 is the 0 axis. Coordinates to the right of the 0 axis are positive and to the left are negative. Since the coordinate for ORGN will be less than the length of a full partition, PLEN, the ratio ORGN/PLEN is a fraction less than 1. The integer value for FIRST in S7 will therefore be 1. The quantity FIRST is indicated as being at the partition boundary line 120(3/4) in FIG. 12.

In statement S8, calculations are made for values in X of ORGN less than 0. Since ORGN is positive and hence greater than 0 for the shape 141, S8 is not employed. Another example in which the ORGN has a negative X coordinate is the shape 142. For the shape 142, the FIRST value becomes a −1 which is indicated as being at the partition boundary line 120(1/2).

In statement S9, the value of NXT is calculated by summing the ORGN and LEN values. In connection with the shape 141, the NXT value falls within the positive region between 0 and +1.

In statement S10, the value of LAST is calculated for positive values of NXT. As shown in FIG. 12, the value of LAST for the shape of 141 is 1 and hence also falls on the boundary line 120(3/4).

Statement S11 is used for negative values of NXT. None of the examples in FIG. 12 has a negative NXT, however, the calculation is analogous to that of statement S8 for negative values of ORGN.

In statement S12, UNDER is calculated based upon the previous calculations of FIRST and LAST and NXT. The various quantities calculated for UNDER and OVER for the shapes 141 through 145 in FIG. 12 are appropriately labeled.

The manner in which these calculations are employed in order to make a determination to which partition column or columns a particular shape is to be allocated are now described in connection with the statements S18 through S26. The statements S14 through S17 are merely for textual comments describing the program.

In statement S18, if FIRST is equal to LAST, then a decision as to which partition column is to receive the COLUMN SHAPE has been made since the shape fits entirely within the column designated by the quantity FIRST. An example where FIRST equals LAST is shape 141. The value of FIRST is +1 and designates the column containing partition 106-3. The X axis processing of shape 141 is then complete. The COLUMN SHAPE in this example includes the original four words for the shape 141 and has the column +1 identification appended as previously described.

In statement S19, the condition of UNDER being less than OFST is examined. Such a condition occurs, for example, both in connection with the shapes 143 and 144. In those conditions, the value of FIRST is changed to equal FIRST +1. That is, the change is from a −1 to 0 thereby changing the designation from the boundary line 120(7/8) to the boundary line 120(8/9). The effect of this change is to place those portions of the shape to the left of boundary line 120(7/8) [but still within the scan field 10(2-8) within the COLUMN SHAPE for the −1 column which contains the partition 106-8. Thereafter that COLUMN SHAPE is subtracted leaving the RESIDUAL COLUMN shape as everything to the right of boundary 120(8/9)].

In statement S20, an examination is made to determine whether OVER is less than OFST. If that condition exists, the value of LAST is set equal to LAST −1. The condition of S20 is not met in connection with the shape 143 so that LAST remains a +1 indicated at the boundary 120(9/10). The result is that the RESIDUAL COLUMN SHAPE [that is, everything to the right of boundary 120(8/9)] is stored as the COLUMN SHAPE for the +1 column containing partition 106-9. In connection with the shape 144, however, OVER is less than OFST, so that LAST is set equal to LAST −1. In connection with the shape 144, therefore, LAST is changed from +1 to 0, that is, from the boundary line 120(9/10) to the boundary line 120(8/9). The result is that the entire shape 144 is stored as the COLUMN SHAPE for the −1 column containing partition 106-8.

In statement S21, the new values of FIRST and LAST as they may have been changed in S19 and S20 are examined. If FIRST is less than or equal to LAST, then a determination has been made as to the partition allocation. In connection with the shape 144, FIRST, now equal to 0, is equal to LAST now also equal to 0. The 0 value for FIRST therefore designates that the partition 106-8 is the one to receive the entire shape 144.

In statement S22, a comparison of OVER and UNDER is made under the condition that FIRST was greater than LAST in S21. Under the condition that UNDER was greater than OVER, S22 would proceed to S23. No example of such a condition is shown in FIG. 12. In FIG. 12, however, the value of OVER is greater than UNDER in connection with shape 145 so that S22 branches to S25 and LAST is set equal to FIRST. In connection with shape 145, FIRST was already set to +2, in connection with S19. Therefore, LAST becomes set equal to +2 in S25. The meaning is in S25 that the shape 145 can be scanned entirely in one partition. The shape 145 is therefore not divided along the boundary 120(12/5) but is scanned entirely within the partition 106-5. The above method places shape 145 in the partition that shape 145 would be most centrally located within.

While the invention has been particularly shown and described with reference to the preferred embodiments thereof, it will be understood by those skilled in the art that those changes in form and details may be made therein without departing from the spirit and the scope of the invention.

TABLE I

| RECORD NO. | WORD 1 X | WORD 2 Y | WORD 3 XL | WORD 4 YL | RECORD NO. | WORD 1 X | WORD 2 Y | WORD 3 XL | WORD 4 YL |
|---|---|---|---|---|---|---|---|---|---|
| 1 | 1 | 5 | 685 | 1 | 61 | −905 | 913 | 10 | 30 |
| 2 | 3 | 682 | 0 | 70 | 62 | −745 | 913 | 10 | 30 |
| 3 | 1606 | 1350 | 0 | 681 | 63 | −617 | 913 | 10 | 30 |
| 4 | 1280 | −1120 | 240 | 240 | 64 | −521 | 913 | 10 | 30 |
| 5 | 1260 | −1040 | 20 | 80 | 65 | −1191 | 815 | 1574 | 10 |
| 6 | 1280 | −720 | 240 | 240 | 66 | −1193 | 697 | 10 | 126 |
| 7 | 1260 | −640 | 20 | 80 | 67 | −1191 | 695 | 1574 | 10 |
| 8 | 1280 | −320 | 240 | 240 | 68 | −585 | 697 | 10 | 126 |
| 9 | 1260 | −240 | 20 | 80 | 69 | −393 | 697 | 10 | 126 |
| 10 | 1280 | 80 | 240 | 240 | 70 | 341 | 573 | 14 | 14 |
| 11 | 1260 | 160 | 20 | 80 | 71 | 341 | 693 | 14 | 14 |
| 12 | 1280 | 480 | 240 | 240 | 72 | 309 | 669 | 14 | 14 |
| 13 | 1260 | 560 | 20 | 80 | 73 | 309 | 621 | 14 | 14 |
| 14 | 1280 | 880 | 240 | 240 | 74 | 311 | 625 | 10 | 54 |
| 15 | 1260 | 960 | 20 | 80 | 75 | 271 | 645 | 14 | 14 |
| 16 | 880 | 1080 | 240 | 240 | 76 | 277 | 573 | 14 | 14 |
| 17 | 960 | 1060 | 80 | 20 | 77 | 277 | 693 | 14 | 14 |
| 18 | 480 | 1080 | 240 | 240 | 78 | 245 | 621 | 14 | 14 |
| 19 | 560 | 1060 | 80 | 20 | 79 | 213 | 573 | 14 | 14 |
| 20 | 80 | 1080 | 240 | 240 | 80 | 213 | 669 | 14 | 14 |
| 21 | 160 | 1060 | 80 | 20 | 81 | 217 | 623 | 36 | 10 |
| 22 | −320 | 1080 | 240 | 240 | 82 | 215 | 625 | 10 | 54 |
| 23 | −240 | 1060 | 80 | 20 | 83 | 175 | 645 | 14 | 14 |
| 24 | −720 | 1080 | 240 | 240 | 84 | 181 | 573 | 14 | 14 |
| 25 | −640 | 1060 | 80 | 20 | 85 | 181 | 693 | 14 | 14 |
| 26 | −1120 | 1080 | 240 | 240 | 86 | 149 | 669 | 14 | 14 |
| 27 | −1040 | 1060 | 80 | 20 | 87 | 149 | 621 | 14 | 14 |
| 28 | −1520 | 880 | 240 | 240 | 88 | 151 | 625 | 10 | 54 |
| 29 | −1280 | 960 | 20 | 80 | 89 | 185 | 647 | 38 | 10 |
| 30 | −1520 | 480 | 240 | 240 | 90 | 111 | 645 | 14 | 14 |
| 31 | −1280 | 560 | 20 | 80 | 91 | 117 | 573 | 14 | 14 |
| 32 | −1520 | 80 | 240 | 240 | 92 | 117 | 693 | 14 | 14 |
| 33 | −1280 | 160 | 20 | 80 | 93 | 85 | 669 | 14 | 14 |
| 34 | −1520 | −320 | 240 | 240 | 94 | 94 | 621 | 14 | 14 |
| 35 | −1280 | −240 | 20 | 80 | 95 | 87 | 625 | 10 | 54 |
| 36 | −1520 | −720 | 240 | 240 | 96 | 121 | 647 | 38 | 10 |
| 37 | −1280 | −640 | 20 | 80 | 97 | 47 | 645 | 14 | 14 |
| 38 | −1520 | −1120 | 240 | 240 | 98 | 53 | 573 | 14 | 14 |
| 39 | −1280 | −1040 | 20 | 80 | 99 | 53 | 693 | 14 | 14 |
| 40 | −1120 | −1320 | 240 | 240 | 100 | 21 | 669 | 14 | 14 |
| 41 | −1040 | −1080 | 80 | 20 | 101 | 21 | 621 | 14 | 14 |
| 42 | −720 | −1320 | 240 | 240 | 102 | 23 | 625 | 10 | 54 |
| 43 | −640 | −1080 | 80 | 20 | 103 | 57 | 647 | 38 | 10 |
| 44 | −320 | −1320 | 240 | 240 | 104 | −17 | 645 | 14 | 14 |
| 45 | −240 | −1080 | 80 | 20 | 105 | −11 | 573 | 14 | 14 |
| 46 | 80 | −1320 | 240 | 240 | 106 | −11 | 693 | 14 | 14 |
| 47 | 160 | −1080 | 80 | 20 | 107 | −43 | 669 | 14 | 14 |
| 48 | 480 | −1320 | 240 | 240 | 108 | −43 | 621 | 14 | 14 |
| 49 | 560 | −1080 | 80 | 20 | 109 | −41 | 625 | 10 | 54 |
| 50 | 880 | −1320 | 240 | 240 | 110 | −7 | 647 | 38 | 10 |
| 51 | 960 | −1080 | 80 | 20 | 111 | −81 | 645 | 14 | 14 |
| 52 | 366 | 696 | 28 | 128 | 112 | −75 | 573 | 14 | 14 |

TABLE I-continued

| RECORD NO. | WORD 1 X | WORD 2 Y | WORD 3 XL | WORD 4 YL | RECORD NO. | WORD 1 X | WORD 2 Y | WORD 3 XL | WORD 4 YL |
|---|---|---|---|---|---|---|---|---|---|
| 53 | −1260 | 575 | 40 | 370 | 113 | −75 | 693 | 14 | 14 |
| 54 | 376 | 812 | 20 | 216 | 114 | −107 | 669 | 14 | 14 |
| 55 | −208 | 1010 | 602 | 20 | 115 | −107 | 621 | 14 | 14 |
| 56 | −210 | 1012 | 20 | 76 | 116 | −105 | 625 | 10 | 54 |
| 57 | −1223 | 575 | 1574 | 10 | 117 | −71 | 647 | 38 | 10 |
| 58 | −1223 | 935 | 1478 | 10 | 118 | −145 | 645 | 14 | 14 |
| 59 | −393 | 913 | 10 | 30 | 119 | −139 | 573 | 14 | 14 |
| 60 | −1223 | 911 | 838 | 10 | 120 | −139 | 693 | 14 | 14 |
| 121 | −171 | 669 | 14 | 14 | 181 | −299 | 885 | 14 | 14 |
| 122 | −171 | 621 | 14 | 14 | 182 | −297 | 841 | 10 | 54 |
| 123 | −169 | 625 | 10 | 54 | 183 | −261 | 861 | 14 | 14 |
| 124 | −135 | 647 | 38 | 10 | 184 | −267 | 933 | 14 | 14 |
| 125 | −209 | 645 | 14 | 14 | 185 | −267 | 813 | 14 | 14 |
| 126 | −203 | 573 | 14 | 14 | 186 | −235 | 837 | 14 | 14 |
| 127 | −203 | 693 | 14 | 14 | 187 | −235 | 885 | 14 | 14 |
| 128 | −235 | 669 | 14 | 14 | 188 | −233 | 841 | 10 | 54 |
| 129 | −235 | 621 | 14 | 14 | 189 | −295 | 863 | 38 | 10 |
| 130 | −233 | 625 | 10 | 54 | 190 | −197 | 861 | 14 | 14 |
| 131 | −199 | 647 | 38 | 10 | 191 | −203 | 933 | 14 | 14 |
| 132 | −273 | 645 | 14 | 14 | 192 | −203 | 813 | 14 | 14 |
| 133 | −267 | 573 | 14 | 14 | 193 | −171 | 837 | 14 | 14 |
| 134 | −267 | 693 | 14 | 14 | 194 | −171 | 885 | 14 | 14 |
| 135 | −299 | 669 | 14 | 14 | 195 | −169 | 841 | 10 | 54 |
| 136 | −299 | 621 | 14 | 14 | 196 | −231 | 863 | 38 | 10 |
| 137 | −297 | 625 | 10 | 54 | 197 | −133 | 861 | 14 | 14 |
| 138 | −263 | 647 | 38 | 10 | 198 | −139 | 933 | 14 | 14 |
| 139 | −337 | 645 | 14 | 14 | 199 | −139 | 813 | 14 | 14 |
| 140 | −331 | 573 | 14 | 14 | 200 | −107 | 837 | 14 | 14 |
| 141 | −331 | 693 | 14 | 14 | 201 | −107 | 885 | 14 | 14 |
| 142 | −363 | 669 | 14 | 14 | 202 | −105 | 841 | 10 | 54 |
| 143 | −363 | 621 | 14 | 14 | 203 | −167 | 863 | 38 | 10 |
| 144 | −361 | 625 | 10 | 54 | 204 | −69 | 861 | 14 | 14 |
| 145 | −327 | 647 | 38 | 10 | 205 | −75 | 933 | 14 | 14 |
| 146 | −401 | 645 | 14 | 14 | 206 | −75 | 813 | 14 | 14 |
| 147 | −395 | 573 | 14 | 14 | 207 | −43 | 837 | 14 | 14 |
| 148 | −395 | 693 | 14 | 14 | 208 | −43 | 885 | 14 | 14 |
| 149 | −427 | 669 | 14 | 14 | 209 | −41 | 841 | 10 | 54 |
| 150 | −427 | 621 | 14 | 14 | 210 | −103 | 863 | 38 | 10 |
| 151 | −425 | 625 | 10 | 54 | 211 | −5 | 861 | 14 | 14 |
| 152 | −391 | 647 | 38 | 10 | 212 | −11 | 933 | 14 | 14 |
| 153 | −465 | 645 | 14 | 14 | 213 | −11 | 813 | 14 | 14 |
| 154 | −459 | 573 | 14 | 14 | 214 | 21 | 837 | 14 | 14 |
| 155 | −459 | 693 | 14 | 14 | 215 | 21 | 885 | 14 | 14 |
| 156 | −491 | 669 | 14 | 14 | 216 | 23 | 841 | 10 | 54 |
| 157 | −491 | 621 | 14 | 14 | 217 | −39 | 863 | 38 | 10 |
| 158 | −489 | 625 | 10 | 54 | 218 | 59 | 861 | 14 | 14 |
| 159 | −455 | 647 | 38 | 10 | 219 | 53 | 933 | 14 | 14 |
| 160 | −523 | 573 | 14 | 14 | 220 | 53 | 813 | 14 | 14 |
| 161 | −523 | 693 | 14 | 14 | 221 | 85 | 837 | 14 | 14 |
| 162 | −555 | 669 | 14 | 14 | 222 | 85 | 885 | 14 | 14 |
| 163 | −555 | 621 | 14 | 14 | 223 | 87 | 841 | 10 | 54 |
| 164 | −553 | 625 | 10 | 54 | 224 | 25 | 863 | 38 | 10 |
| 165 | −523 | 933 | 14 | 14 | 225 | 123 | 861 | 14 | 14 |
| 166 | −459 | 933 | 14 | 14 | 226 | 117 | 933 | 14 | 14 |
| 167 | −395 | 933 | 14 | 14 | 227 | 117 | 813 | 14 | 14 |
| 168 | −395 | 813 | 14 | 14 | 228 | 149 | 837 | 14 | 14 |
| 169 | −459 | 813 | 14 | 14 | 229 | 149 | 885 | 14 | 14 |
| 170 | −523 | 813 | 14 | 14 | 230 | 151 | 841 | 10 | 54 |
| 171 | −491 | 885 | 14 | 14 | 231 | 89 | 863 | 38 | 10 |
| 172 | −491 | 837 | 14 | 14 | 232 | 187 | 861 | 14 | 14 |
| 173 | −427 | 885 | 14 | 14 | 233 | 181 | 933 | 14 | 14 |
| 174 | −427 | 837 | 14 | 14 | 234 | 181 | 813 | 14 | 14 |
| 175 | −487 | 887 | 70 | 10 | 235 | 213 | 837 | 14 | 14 |
| 176 | −425 | 841 | 10 | 54 | 236 | 213 | 885 | 14 | 14 |
| 177 | −487 | 839 | 70 | 10 | 237 | 215 | 841 | 10 | 54 |
| 178 | −331 | 933 | 14 | 14 | 238 | 153 | 863 | 38 | 10 |
| 179 | −331 | 813 | 14 | 14 | 239 | 245 | 933 | 14 | 14 |
| 180 | −299 | 837 | 14 | 14 | 240 | 245 | 813 | 14 | 14 |
| 241 | 277 | 837 | 14 | 14 | 301 | 169 | 1055 | 34 | 10 |
| 242 | 277 | 885 | 14 | 14 | 302 | −1195 | 621 | 14 | 14 |
| 243 | 279 | 841 | 10 | 54 | 303 | −1163 | 621 | 14 | 14 |
| 244 | 309 | 885 | 14 | 14 | 304 | −1163 | 669 | 14 | 14 |
| 245 | 341 | 885 | 14 | 14 | 305 | −1195 | 669 | 14 | 14 |
| 246 | 341 | 837 | 14 | 14 | 306 | −1193 | 625 | 10 | 54 |
| 247 | 309 | 837 | 14 | 14 | 307 | −1161 | 625 | 10 | 54 |
| 248 | 311 | 841 | 10 | 54 | 308 | −1125 | 645 | 14 | 14 |
| 249 | 343 | 841 | 10 | 54 | 309 | −1131 | 573 | 14 | 14 |
| 250 | 325 | 525 | 14 | 14 | 310 | −1131 | 693 | 14 | 14 |
| 251 | 413 | 1005 | 14 | 14 | 311 | −1099 | 621 | 14 | 14 |
| 252 | 349 | 981 | 14 | 14 | 312 | −1067 | 573 | 14 | 14 |
| 253 | 309 | 981 | 14 | 14 | 313 | −1067 | 669 | 14 | 14 |
| 254 | 261 | 1045 | 14 | 14 | 314 | −1095 | 623 | 38 | 10 |
| 255 | 229 | 765 | 14 | 14 | 315 | −1065 | 625 | 10 | 54 |
| 256 | −315 | 765 | 14 | 14 | 316 | −1029 | 645 | 14 | 14 |
| 257 | −507 | 765 | 14 | 14 | 317 | −1035 | 573 | 14 | 14 |
| 258 | 169 | 981 | 14 | 14 | 318 | −1035 | 693 | 14 | 14 |
| 259 | 161 | 981 | 14 | 14 | 319 | −1003 | 669 | 14 | 14 |
| 260 | 169 | 1045 | 14 | 14 | 320 | −1003 | 621 | 14 | 14 |
| 261 | 161 | 1045 | 14 | 14 | 321 | −971 | 621 | 14 | 14 |
| 262 | −363 | 717 | 14 | 14 | 322 | −971 | 669 | 14 | 14 |

TABLE I-continued

| RECORD NO. | WORD 1 X | WORD 2 Y | WORD 3 XL | WORD 4 YL | RECORD NO. | WORD 1 X | WORD 2 Y | WORD 3 XL | WORD 4 YL |
|---|---|---|---|---|---|---|---|---|---|
| 263 | −555 | 717 | 14 | 14 | 323 | −1001 | 625 | 10 | 54 |
| 264 | 213 | 789 | 14 | 14 | 324 | −969 | 625 | 10 | 54 |
| 265 | 309 | 789 | 14 | 14 | 325 | −907 | 621 | 14 | 14 |
| 266 | 341 | 957 | 14 | 14 | 326 | −875 | 621 | 14 | 14 |
| 267 | 277 | 957 | 14 | 14 | 327 | −875 | 669 | 14 | 14 |
| 268 | −427 | 957 | 14 | 14 | 328 | −907 | 669 | 14 | 14 |
| 269 | −491 | 957 | 14 | 14 | 329 | −905 | 625 | 10 | 54 |
| 270 | 329 | 527 | 134 | 10 | 330 | −873 | 625 | 10 | 54 |
| 271 | 455 | 529 | 10 | 366 | 331 | −805 | 645 | 14 | 14 |
| 272 | 457 | 887 | 766 | 10 | 332 | −811 | 573 | 14 | 14 |
| 273 | 1215 | 197 | 10 | 698 | 333 | −811 | 693 | 14 | 14 |
| 274 | 1217 | 195 | 86 | 10 | 334 | −779 | 669 | 14 | 14 |
| 275 | 1237 | 599 | 66 | 10 | 335 | −779 | 621 | 14 | 14 |
| 276 | 1235 | 601 | 10 | 342 | 336 | −777 | 625 | 10 | 54 |
| 277 | 433 | 935 | 810 | 10 | 337 | −741 | 645 | 14 | 14 |
| 278 | 431 | 601 | 10 | 342 | 338 | −747 | 573 | 14 | 14 |
| 279 | 281 | 599 | 158 | 10 | 339 | −747 | 693 | 14 | 14 |
| 280 | 279 | 601 | 10 | 54 | 340 | −715 | 621 | 14 | 14 |
| 281 | 313 | 671 | 102 | 10 | 341 | −683 | 573 | 14 | 14 |
| 282 | 407 | 673 | 10 | 318 | 342 | −663 | 669 | 14 | 14 |
| 283 | 409 | 983 | 894 | 10 | 343 | −711 | 623 | 38 | 10 |
| 284 | 995 | 1009 | 10 | 74 | 344 | −681 | 625 | 10 | 54 |
| 285 | 417 | 1007 | 586 | 10 | 345 | −651 | 621 | 14 | 14 |
| 286 | 343 | 961 | 10 | 30 | 346 | −619 | 621 | 14 | 14 |
| 287 | 265 | 1051 | 338 | 10 | 347 | −619 | 669 | 14 | 14 |
| 288 | 595 | 1053 | 10 | 30 | 348 | −651 | 669 | 14 | 14 |
| 289 | 281 | 983 | 38 | 10 | 349 | −649 | 625 | 10 | 54 |
| 290 | 279 | 961 | 10 | 30 | 350 | −617 | 625 | 10 | 54 |
| 291 | 217 | 791 | 102 | 10 | 351 | −1195 | 933 | 14 | 14 |
| 292 | 231 | 769 | 10 | 30 | 352 | −1195 | 813 | 14 | 14 |
| 293 | −359 | 767 | 54 | 10 | 353 | −1163 | 837 | 14 | 14 |
| 294 | −361 | 721 | 10 | 54 | 354 | −1163 | 885 | 14 | 14 |
| 295 | −551 | 767 | 54 | 10 | 355 | −1131 | 933 | 14 | 14 |
| 296 | −553 | 721 | 10 | 54 | 356 | −1131 | 813 | 14 | 14 |
| 297 | −551 | 671 | 70 | 10 | 357 | −1161 | 841 | 10 | 54 |
| 298 | −487 | 959 | 70 | 10 | 358 | −1093 | 861 | 14 | 14 |
| 299 | −425 | 961 | 10 | 30 | 359 | −1099 | 933 | 14 | 14 |
| 300 | −423 | 983 | 598 | 10 | 360 | −1099 | 813 | 14 | 14 |
| 361 | −1067 | 837 | 14 | 14 | 421 | −871 | 959 | 70 | 10 |
| 362 | −1067 | 885 | 14 | 14 | 422 | −605 | 1009 | 10 | 74 |
| 363 | −1035 | 933 | 14 | 14 | 423 | −647 | 1007 | 50 | 10 |
| 364 | −1035 | 813 | 14 | 14 | 424 | −649 | 961 | 10 | 54 |
| 365 | −1065 | 841 | 10 | 54 | 425 | −711 | 959 | 70 | 10 |
| 366 | −907 | 933 | 14 | 14 | 426 | −1175 | 503 | 550 | 10 |
| 367 | −843 | 933 | 14 | 14 | 427 | −1159 | 551 | 198 | 10 |
| 368 | −779 | 933 | 14 | 14 | 428 | −617 | 601 | 10 | 30 |
| 369 | −779 | 813 | 14 | 14 | 429 | −807 | 599 | 198 | 10 |
| 370 | −843 | 813 | 14 | 14 | 430 | −809 | 601 | 10 | 54 |
| 371 | −907 | 813 | 14 | 14 | 431 | −871 | 647 | 70 | 10 |
| 372 | −875 | 885 | 14 | 14 | 432 | −905 | 601 | 10 | 30 |
| 373 | −875 | 837 | 14 | 14 | 433 | −1063 | 599 | 166 | 10 |
| 374 | −811 | 885 | 14 | 14 | 434 | −1065 | 601 | 10 | 54 |
| 375 | −811 | 837 | 14 | 14 | 435 | −1063 | 647 | 38 | 10 |
| 376 | −871 | 887 | 70 | 10 | 436 | −1159 | 647 | 38 | 10 |
| 377 | −809 | 841 | 10 | 54 | 437 | −775 | 647 | 38 | 10 |
| 378 | −871 | 839 | 70 | 10 | 438 | −679 | 623 | 38 | 10 |
| 379 | −747 | 933 | 14 | 14 | 439 | −759 | 743 | 134 | 10 |
| 380 | −683 | 933 | 14 | 14 | 440 | −761 | 721 | 10 | 30 |
| 381 | −619 | 933 | 14 | 14 | 441 | −1159 | 719 | 406 | 10 |
| 382 | −619 | 813 | 14 | 14 | 442 | −1161 | 721 | 10 | 78 |
| 383 | −683 | 813 | 14 | 14 | 443 | −1065 | 745 | 10 | 54 |
| 384 | −747 | 813 | 14 | 14 | 444 | −1063 | 743 | 230 | 10 |
| 385 | −715 | 885 | 14 | 14 | 445 | −1159 | 863 | 70 | 10 |
| 386 | −715 | 837 | 14 | 14 | 446 | 470 | −763 | 40 | 86 |
| 387 | −651 | 885 | 14 | 14 | 447 | 1100 | −780 | 40 | 120 |
| 388 | −651 | 837 | 14 | 14 | 448 | 519 | −653 | 10 | 10 |
| 389 | −711 | 887 | 70 | 10 | 449 | 515 | −605 | 10 | 10 |
| 390 | −649 | 841 | 10 | 54 | 450 | 515 | −685 | 10 | 10 |
| 391 | −711 | 839 | 70 | 10 | 451 | 535 | −669 | 10 | 10 |
| 392 | −635 | 501 | 14 | 14 | 452 | 535 | −637 | 10 | 10 |
| 393 | −843 | 501 | 14 | 14 | 453 | 537 | −665 | 6 | 34 |
| 394 | −1179 | 501 | 14 | 14 | 454 | 499 | −651 | 22 | 6 |
| 395 | −1083 | 525 | 14 | 14 | 455 | 559 | −653 | 10 | 10 |
| 396 | −699 | 525 | 14 | 14 | 456 | 555 | −605 | 10 | 10 |
| 397 | −939 | 717 | 14 | 14 | 457 | 555 | −685 | 10 | 10 |
| 398 | −635 | 741 | 14 | 14 | 458 | 575 | −637 | 10 | 10 |
| 399 | −843 | 741 | 14 | 14 | 459 | 595 | −669 | 10 | 10 |
| 400 | −891 | 741 | 14 | 14 | 460 | 595 | −605 | 10 | 10 |
| 401 | −987 | 741 | 14 | 14 | 461 | 579 | −635 | 22 | 6 |
| 402 | −1163 | 741 | 14 | 14 | 462 | 597 | −665 | 6 | 34 |
| 403 | −1179 | 981 | 14 | 14 | 463 | 619 | −653 | 10 | 10 |
| 404 | −971 | 549 | 14 | 14 | 464 | 615 | −605 | 10 | 10 |
| 405 | −1163 | 549 | 14 | 14 | 465 | 615 | −685 | 10 | 10 |
| 406 | −1195 | 549 | 14 | 14 | 466 | 635 | −669 | 10 | 10 |
| 407 | −1163 | 789 | 14 | 14 | 467 | 635 | −637 | 10 | 10 |
| 408 | −1067 | 789 | 14 | 14 | 468 | 637 | −665 | 6 | 34 |
| 409 | −875 | 957 | 14 | 14 | 469 | 599 | −651 | 22 | 6 |
| 410 | −811 | 957 | 14 | 14 | 470 | 659 | −653 | 10 | 10 |
| 411 | −715 | 957 | 14 | 14 | 471 | 655 | −605 | 10 | 10 |
| 412 | −651 | 957 | 14 | 14 | 472 | 655 | −685 | 10 | 10 |

TABLE I-continued

| RECORD NO. | WORD 1 X | WORD 2 Y | WORD 3 XL | WORD 4 YL | RECORD NO. | WORD 1 X | WORD 2 Y | WORD 3 XL | WORD 4 YL |
|---|---|---|---|---|---|---|---|---|---|
| 413 | −1079 | 527 | 1414 | 10 | 473 | 675 | −669 | 10 | 10 |
| 414 | −1283 | 195 | 66 | 10 | 474 | 675 | −637 | 10 | 10 |
| 415 | −1225 | 197 | 10 | 362 | 475 | 677 | −665 | 6 | 34 |
| 416 | −1223 | 551 | 38 | 10 | 476 | 639 | −651 | 22 | 6 |
| 417 | −1283 | 983 | 114 | 10 | 477 | 699 | −653 | 10 | 10 |
| 418 | −1005 | 1009 | 10 | 74 | 478 | 695 | −605 | 10 | 10 |
| 419 | −1003 | 1007 | 138 | 10 | 479 | 695 | −685 | 10 | 10 |
| 420 | −873 | 961 | 10 | 54 | 480 | 715 | −669 | 10 | 10 |
| 481 | 715 | −637 | 10 | 10 | 541 | 1055 | −685 | 10 | 10 |
| 482 | 717 | −665 | 6 | 34 | 542 | 1075 | −669 | 10 | 10 |
| 483 | 679 | −651 | 22 | 6 | 543 | 1075 | −637 | 10 | 10 |
| 484 | 739 | −653 | 10 | 10 | 544 | 1077 | −665 | 6 | 34 |
| 485 | 735 | −605 | 10 | 10 | 545 | 1051 | −797 | 10 | 10 |
| 486 | 735 | −685 | 10 | 10 | 546 | 1055 | −845 | 10 | 10 |
| 487 | 755 | −669 | 10 | 10 | 547 | 1055 | −765 | 10 | 10 |
| 488 | 755 | −637 | 10 | 10 | 548 | 1035 | −781 | 10 | 10 |
| 489 | 757 | −665 | 6 | 34 | 549 | 1035 | −813 | 10 | 10 |
| 490 | 719 | −651 | 22 | 6 | 550 | 1015 | −845 | 10 | 10 |
| 491 | 779 | −653 | 10 | 10 | 551 | 1015 | −765 | 10 | 10 |
| 492 | 775 | −605 | 10 | 10 | 552 | 995 | −781 | 10 | 10 |
| 493 | 775 | −685 | 10 | 10 | 553 | 995 | −813 | 10 | 10 |
| 494 | 795 | −669 | 10 | 10 | 554 | 975 | −845 | 10 | 10 |
| 495 | 795 | −637 | 10 | 10 | 555 | 975 | −765 | 10 | 10 |
| 496 | 797 | −665 | 6 | 34 | 556 | 999 | −811 | 42 | 6 |
| 497 | 759 | −651 | 22 | 6 | 557 | 997 | −809 | 6 | 34 |
| 498 | 819 | −653 | 10 | 10 | 558 | 999 | −779 | 42 | 6 |
| 499 | 815 | −605 | 10 | 10 | 559 | 935 | −845 | 10 | 10 |
| 500 | 815 | −685 | 10 | 10 | 560 | 935 | −765 | 10 | 10 |
| 501 | 835 | −669 | 10 | 10 | 561 | 915 | −781 | 10 | 10 |
| 502 | 835 | −637 | 10 | 10 | 562 | 915 | −813 | 10 | 10 |
| 503 | 837 | −665 | 6 | 34 | 563 | 917 | −809 | 6 | 34 |
| 504 | 799 | −651 | 22 | 6 | 564 | 891 | −797 | 10 | 10 |
| 505 | 859 | −653 | 10 | 10 | 565 | 895 | −845 | 10 | 10 |
| 506 | 855 | −605 | 10 | 10 | 566 | 895 | −765 | 10 | 10 |
| 507 | 855 | −685 | 10 | 10 | 567 | 875 | −781 | 10 | 10 |
| 508 | 875 | −669 | 10 | 10 | 568 | 875 | −813 | 10 | 10 |
| 509 | 875 | −637 | 10 | 10 | 569 | 877 | −809 | 6 | 34 |
| 510 | 877 | −665 | 6 | 34 | 570 | 899 | −795 | 22 | 6 |
| 511 | 839 | −651 | 22 | 6 | 571 | 851 | −797 | 10 | 10 |
| 512 | 899 | −653 | 10 | 10 | 572 | 855 | −845 | 10 | 10 |
| 513 | 895 | −605 | 10 | 10 | 573 | 855 | −765 | 10 | 10 |
| 514 | 895 | −685 | 10 | 10 | 574 | 835 | −781 | 10 | 10 |
| 515 | 915 | −669 | 10 | 10 | 575 | 835 | −813 | 10 | 10 |
| 516 | 915 | −637 | 10 | 10 | 576 | 837 | −809 | 6 | 34 |
| 517 | 917 | −665 | 6 | 34 | 577 | 859 | −795 | 22 | 6 |
| 518 | 879 | −651 | 22 | 6 | 578 | 811 | −797 | 10 | 10 |
| 519 | 939 | −653 | 10 | 10 | 579 | 815 | −845 | 10 | 10 |
| 520 | 935 | −605 | 10 | 10 | 580 | 815 | −765 | 10 | 10 |
| 521 | 935 | −685 | 10 | 10 | 581 | 795 | −781 | 10 | 10 |
| 522 | 955 | −669 | 10 | 10 | 582 | 795 | −813 | 10 | 10 |
| 523 | 955 | −637 | 10 | 10 | 583 | 797 | −809 | 6 | 34 |
| 524 | 957 | −665 | 6 | 34 | 584 | 819 | −795 | 22 | 6 |
| 525 | 919 | −651 | 22 | 6 | 585 | 771 | −797 | 10 | 10 |
| 526 | 979 | −653 | 10 | 10 | 586 | 775 | −845 | 10 | 10 |
| 527 | 975 | −605 | 10 | 10 | 587 | 775 | −765 | 10 | 10 |
| 528 | 975 | −685 | 10 | 10 | 588 | 755 | −781 | 10 | 10 |
| 529 | 995 | −669 | 10 | 10 | 589 | 755 | −813 | 10 | 10 |
| 530 | 995 | −637 | 10 | 10 | 590 | 757 | −809 | 6 | 34 |
| 531 | 997 | −665 | 6 | 34 | 591 | 779 | −795 | 22 | 6 |
| 532 | 959 | −651 | 22 | 6 | 592 | 731 | −797 | 10 | 10 |
| 533 | 1019 | −653 | 10 | 10 | 593 | 735 | −845 | 10 | 10 |
| 534 | 1015 | −605 | 10 | 10 | 594 | 735 | −765 | 10 | 10 |
| 535 | 1015 | −685 | 10 | 10 | 595 | 715 | −781 | 10 | 10 |
| 536 | 1035 | −669 | 10 | 10 | 596 | 715 | −813 | 10 | 10 |
| 537 | 1035 | −637 | 10 | 10 | 597 | 717 | −809 | 6 | 34 |
| 538 | 1037 | −665 | 6 | 34 | 598 | 739 | −795 | 22 | 6 |
| 539 | 999 | −651 | 22 | 6 | 599 | 691 | −797 | 10 | 10 |
| 540 | 1055 | −605 | 10 | 10 | 600 | 695 | −845 | 10 | 10 |
| 601 | 695 | −765 | 10 | 10 | 661 | −1005 | −1103 | 10 | 276 |
| 602 | 675 | −781 | 10 | 10 | 662 | 519 | −603 | 602 | 6 |
| 603 | 675 | −813 | 10 | 10 | 663 | 579 | −843 | 542 | 6 |
| 604 | 677 | −809 | 6 | 34 | 664 | 479 | −763 | 582 | 6 |
| 605 | 699 | −795 | 22 | 6 | 665 | 1017 | −761 | 6 | 82 |
| 606 | 651 | −797 | 10 | 10 | 666 | 479 | −683 | 582 | 6 |
| 607 | 655 | −845 | 10 | 10 | 667 | 999 | −859 | 182 | 6 |
| 608 | 655 | −765 | 10 | 10 | 668 | 577 | −889 | 6 | 18 |
| 609 | 635 | −781 | 10 | 10 | 669 | 579 | −891 | 422 | 6 |
| 610 | 635 | −813 | 10 | 10 | 670 | 517 | −921 | 6 | 66 |
| 611 | 637 | −809 | 6 | 34 | 671 | 519 | −923 | 82 | 6 |
| 612 | 659 | −795 | 22 | 6 | 672 | 449 | −651 | 72 | 6 |
| 613 | 611 | −797 | 10 | 10 | 673 | 419 | −635 | 122 | 6 |
| 614 | 615 | −845 | 10 | 10 | 674 | 557 | −649 | 6 | 34 |
| 615 | 615 | −765 | 10 | 10 | 675 | 389 | −619 | 172 | 6 |
| 616 | 595 | −781 | 10 | 10 | 676 | 1039 | −667 | 42 | 6 |
| 617 | 595 | −813 | 10 | 10 | 677 | 1077 | −793 | 6 | 130 |
| 618 | 597 | −809 | 6 | 34 | 678 | 1059 | −795 | 22 | 6 |
| 619 | 619 | −795 | 22 | 6 | 679 | 957 | −729 | 6 | 34 |
| 620 | 575 | −845 | 10 | 10 | 680 | 939 | −731 | 22 | 6 |
| 621 | 575 | −765 | 10 | 10 | 681 | 597 | −745 | 6 | 34 |
| 622 | 555 | −781 | 10 | 10 | 682 | 539 | −747 | 62 | 6 |

TABLE I-continued

| RECORD NO. | WORD 1 X | WORD 2 Y | WORD 3 XL | WORD 4 YL | RECORD NO. | WORD 1 X | WORD 2 Y | WORD 3 XL | WORD 4 YL |
|---|---|---|---|---|---|---|---|---|---|
| 623 | 555 | −813 | 10 | 10 | 683 | 539 | −875 | 22 | 6 |
| 624 | 557 | −809 | 6 | 34 | 684 | 557 | −873 | 6 | 18 |
| 625 | 515 | −861 | 10 | 10 | 685 | 0 | 0 | 0 | 0 |
| 626 | 515 | −813 | 10 | 10 | | | | | |
| 627 | 515 | −781 | 10 | 10 | | | | | |
| 628 | 535 | −749 | 10 | 10 | | | | | |
| 629 | 535 | −781 | 10 | 10 | | | | | |
| 630 | 535 | −813 | 10 | 10 | | | | | |
| 631 | 537 | −809 | 6 | 34 | | | | | |
| 632 | 517 | −809 | 6 | 34 | | | | | |
| 633 | 595 | −717 | 10 | 10 | | | | | |
| 634 | 935 | −733 | 10 | 10 | | | | | |
| 635 | 535 | −877 | 10 | 10 | | | | | |
| 636 | 575 | −877 | 10 | 10 | | | | | |
| 637 | 955 | −701 | 10 | 10 | | | | | |
| 638 | 535 | −749 | 10 | 10 | | | | | |
| 639 | 595 | −749 | 10 | 10 | | | | | |
| 640 | 515 | −861 | 10 | 10 | | | | | |
| 641 | 555 | −861 | 10 | 10 | | | | | |
| 642 | 995 | −861 | 10 | 10 | | | | | |
| 643 | 1035 | −861 | 10 | 10 | | | | | |
| 644 | 1117 | −605 | 186 | 10 | | | | | |
| 645 | 1115 | −841 | 10 | 244 | | | | | |
| 646 | 1175 | −1003 | 10 | 148 | | | | | |
| 647 | 1177 | −1005 | 126 | 10 | | | | | |
| 648 | 995 | −1103 | 10 | 216 | | | | | |
| 649 | 595 | −1103 | 10 | 184 | | | | | |
| 650 | 475 | −923 | 10 | 166 | | | | | |
| 651 | 197 | −925 | 286 | 10 | | | | | |
| 652 | 195 | −1103 | 10 | 186 | | | | | |
| 653 | 445 | −893 | 10 | 246 | | | | | |
| 654 | −203 | −895 | 656 | 10 | | | | | |
| 655 | −205 | −1103 | 10 | 216 | | | | | |
| 656 | 415 | −863 | 10 | 232 | | | | | |
| 657 | −603 | −865 | 1026 | 10 | | | | | |
| 658 | −605 | −1103 | 10 | 246 | | | | | |
| 659 | 385 | −833 | 10 | 218 | | | | | |
| 660 | −1003 | −835 | 1396 | 10 | | | | | |

TABLE II

| RECORD NO. | WORD 1 X | WORD 2 Y | WORD 3 XL | WORD 4 YL | RECORD NO. | WORD 1 X | WORD 2 Y | WORD 3 XL | WORD 4 YL |
|---|---|---|---|---|---|---|---|---|---|
| 1 | 1 | 5 | 685 | 1 | 61 | 809 | 759 | 10 | 10 |
| 2 | 3 | 733 | 0 | 70 | 62 | 805 | 807 | 10 | 10 |
| 3 | 1606 | 1350 | 0 | 10 | 63 | 805 | 727 | 10 | 10 |
| 4 | −1204 | −900 | 0 | 0 | 64 | 825 | 743 | 10 | 10 |
| 5 | 803 | 900 | 0 | 8 | 65 | 825 | 775 | 10 | 10 |
| 6 | 196 | 692 | 240 | 240 | 66 | 827 | 747 | 6 | 34 |
| 7 | 436 | 772 | 20 | 80 | 67 | 789 | 761 | 22 | 6 |
| 8 | 196 | 292 | 240 | 240 | 68 | 849 | 759 | 10 | 10 |
| 9 | 436 | 372 | 20 | 80 | 69 | 845 | 807 | 10 | 10 |
| 10 | 596 | 92 | 240 | 240 | 70 | 845 | 727 | 10 | 10 |
| 11 | 676 | 332 | 80 | 20 | 71 | 865 | 743 | 10 | 10 |
| 12 | 713 | 577 | 200 | 10 | 72 | 865 | 775 | 10 | 10 |
| 13 | 711 | 309 | 10 | 276 | 73 | 867 | 747 | 6 | 34 |
| 14 | 803 | 0 | 0 | 0 | 74 | 829 | 761 | 22 | 6 |
| 15 | 803 | 900 | 0 | 9 | 75 | 889 | 759 | 10 | 10 |
| 16 | 193 | 92 | 240 | 240 | 76 | 885 | 807 | 10 | 10 |
| 17 | 273 | 332 | 80 | 20 | 77 | 885 | 727 | 10 | 10 |
| 18 | 593 | 92 | 240 | 240 | 78 | 905 | 743 | 10 | 10 |
| 19 | 673 | 332 | 80 | 20 | 79 | 905 | 775 | 10 | 10 |
| 20 | 710 | 517 | 203 | 10 | 80 | 907 | 747 | 6 | 34 |
| 21 | 708 | 309 | 10 | 216 | 81 | 869 | 761 | 22 | 6 |
| 22 | 310 | 547 | 603 | 10 | 82 | 905 | 631 | 10 | 10 |
| 23 | 308 | 309 | 10 | 246 | 83 | 905 | 599 | 10 | 10 |
| 24 | 110 | 577 | 803 | 10 | 84 | 907 | 603 | 6 | 34 |
| 25 | 803 | 0 | 0 | 0 | 85 | 881 | 615 | 10 | 10 |
| 26 | 803 | 900 | 0 | 139 | 86 | 885 | 567 | 10 | 10 |
| 27 | 190 | 92 | 240 | 240 | 87 | 885 | 647 | 10 | 10 |
| 28 | 270 | 332 | 80 | 20 | 88 | 865 | 631 | 10 | 10 |
| 29 | 590 | 92 | 240 | 240 | 89 | 865 | 599 | 10 | 10 |
| 30 | 670 | 332 | 80 | 20 | 90 | 867 | 603 | 6 | 34 |
| 31 | 580 | 649 | 40 | 86 | 91 | 889 | 617 | 22 | 6 |
| 32 | 629 | 759 | 10 | 10 | 92 | 841 | 615 | 10 | 10 |
| 33 | 625 | 807 | 10 | 10 | 93 | 845 | 567 | 10 | 10 |
| 34 | 625 | 727 | 10 | 10 | 94 | 845 | 647 | 10 | 10 |
| 35 | 645 | 743 | 10 | 10 | 95 | 825 | 631 | 10 | 10 |
| 36 | 645 | 775 | 10 | 10 | 96 | 825 | 599 | 10 | 10 |
| 37 | 647 | 747 | 6 | 34 | 97 | 827 | 603 | 6 | 34 |
| 38 | 609 | 761 | 22 | 6 | 98 | 849 | 617 | 22 | 6 |
| 39 | 669 | 759 | 10 | 10 | 99 | 801 | 615 | 10 | 10 |
| 40 | 665 | 807 | 10 | 10 | 100 | 805 | 567 | 10 | 10 |
| 41 | 665 | 727 | 10 | 10 | 101 | 805 | 647 | 10 | 10 |
| 42 | 685 | 775 | 10 | 10 | 102 | 785 | 631 | 10 | 10 |
| 43 | 705 | 743 | 10 | 10 | 103 | 785 | 599 | 10 | 10 |
| 44 | 705 | 807 | 10 | 10 | 104 | 787 | 603 | 6 | 34 |

TABLE II-continued

| RECORD NO. | WORD 1 X | WORD 2 Y | WORD 3 XL | WORD 4 YL | RECORD NO. | WORD 1 X | WORD 2 Y | WORD 3 XL | WORD 4 YL |
|---|---|---|---|---|---|---|---|---|---|
| 45 | 689 | 777 | 22 | 6 | 105 | 809 | 617 | 22 | 6 |
| 46 | 707 | 747 | 6 | 34 | 106 | 761 | 615 | 10 | 10 |
| 47 | 729 | 759 | 10 | 10 | 107 | 765 | 567 | 10 | 10 |
| 48 | 725 | 807 | 10 | 10 | 108 | 765 | 647 | 10 | 10 |
| 49 | 725 | 727 | 10 | 10 | 109 | 745 | 631 | 10 | 10 |
| 50 | 745 | 743 | 10 | 10 | 110 | 745 | 599 | 10 | 10 |
| 51 | 745 | 775 | 10 | 10 | 111 | 747 | 603 | 6 | 34 |
| 52 | 747 | 747 | 6 | 34 | 112 | 769 | 617 | 22 | 6 |
| 53 | 709 | 761 | 22 | 6 | 113 | 721 | 615 | 10 | 10 |
| 54 | 769 | 759 | 10 | 10 | 114 | 725 | 567 | 10 | 10 |
| 55 | 765 | 807 | 10 | 10 | 115 | 725 | 647 | 10 | 10 |
| 56 | 765 | 727 | 10 | 10 | 116 | 705 | 631 | 10 | 10 |
| 57 | 785 | 743 | 10 | 10 | 117 | 705 | 599 | 10 | 10 |
| 58 | 785 | 775 | 10 | 10 | 118 | 707 | 603 | 6 | 34 |
| 59 | 787 | 747 | 6 | 34 | 119 | 729 | 617 | 22 | 6 |
| 60 | 749 | 761 | 22 | 6 | 120 | 685 | 567 | 10 | 10 |
| 121 | 685 | 647 | 10 | 10 | 181 | 106 | 761 | 22 | 6 |
| 122 | 665 | 631 | 10 | 10 | 182 | 166 | 759 | 10 | 10 |
| 123 | 665 | 599 | 10 | 10 | 183 | 162 | 807 | 10 | 10 |
| 124 | 667 | 603 | 6 | 34 | 184 | 162 | 727 | 10 | 10 |
| 125 | 625 | 551 | 10 | 10 | 185 | 182 | 743 | 10 | 10 |
| 126 | 625 | 599 | 10 | 10 | 186 | 182 | 775 | 10 | 10 |
| 127 | 625 | 631 | 10 | 10 | 187 | 184 | 747 | 6 | 34 |
| 128 | 645 | 663 | 10 | 10 | 188 | 146 | 761 | 22 | 6 |
| 129 | 645 | 631 | 10 | 10 | 189 | 206 | 759 | 10 | 10 |
| 130 | 645 | 599 | 10 | 10 | 190 | 202 | 807 | 10 | 10 |
| 131 | 647 | 603 | 6 | 34 | 191 | 202 | 727 | 10 | 10 |
| 132 | 627 | 603 | 6 | 34 | 192 | 222 | 743 | 10 | 10 |
| 133 | 705 | 695 | 10 | 10 | 193 | 222 | 775 | 10 | 10 |
| 134 | 645 | 535 | 10 | 10 | 194 | 224 | 747 | 6 | 34 |
| 135 | 685 | 535 | 10 | 10 | 195 | 186 | 761 | 22 | 6 |
| 136 | 645 | 663 | 10 | 10 | 196 | 246 | 759 | 10 | 10 |
| 137 | 705 | 663 | 10 | 10 | 197 | 242 | 807 | 10 | 10 |
| 138 | 625 | 551 | 10 | 10 | 198 | 242 | 727 | 10 | 10 |
| 139 | 665 | 551 | 10 | 10 | 199 | 262 | 743 | 10 | 10 |
| 140 | 705 | 309 | 10 | 184 | 200 | 262 | 775 | 10 | 10 |
| 141 | 585 | 489 | 10 | 166 | 201 | 264 | 747 | 6 | 34 |
| 142 | 307 | 487 | 286 | 10 | 202 | 226 | 761 | 22 | 6 |
| 143 | 305 | 309 | 10 | 186 | 203 | 286 | 759 | 10 | 10 |
| 144 | 555 | 519 | 10 | 246 | 204 | 282 | 807 | 10 | 10 |
| 145 | 110 | 517 | 453 | 10 | 205 | 282 | 727 | 10 | 10 |
| 146 | 525 | 549 | 10 | 232 | 206 | 302 | 743 | 10 | 10 |
| 147 | 110 | 547 | 423 | 10 | 207 | 302 | 775 | 10 | 10 |
| 148 | 495 | 579 | 10 | 218 | 208 | 304 | 747 | 6 | 34 |
| 149 | 110 | 577 | 393 | 10 | 209 | 266 | 761 | 22 | 6 |
| 150 | 629 | 809 | 284 | 6 | 210 | 326 | 759 | 10 | 10 |
| 151 | 689 | 569 | 224 | 6 | 211 | 322 | 807 | 10 | 10 |
| 152 | 589 | 649 | 324 | 6 | 212 | 322 | 727 | 10 | 10 |
| 153 | 589 | 729 | 324 | 6 | 213 | 342 | 743 | 10 | 10 |
| 154 | 687 | 523 | 6 | 18 | 214 | 342 | 775 | 10 | 10 |
| 155 | 689 | 521 | 224 | 6 | 215 | 344 | 747 | 6 | 34 |
| 156 | 627 | 491 | 6 | 66 | 216 | 306 | 761 | 22 | 6 |
| 157 | 629 | 489 | 82 | 6 | 217 | 362 | 807 | 10 | 10 |
| 158 | 559 | 761 | 72 | 6 | 218 | 362 | 727 | 10 | 10 |
| 159 | 529 | 777 | 122 | 6 | 219 | 382 | 743 | 10 | 10 |
| 160 | 667 | 763 | 6 | 34 | 220 | 382 | 775 | 10 | 10 |
| 161 | 499 | 793 | 172 | 6 | 221 | 384 | 747 | 6 | 34 |
| 162 | 707 | 667 | 6 | 34 | 222 | 358 | 615 | 10 | 10 |
| 163 | 649 | 665 | 62 | 6 | 223 | 362 | 567 | 10 | 10 |
| 164 | 649 | 537 | 22 | 6 | 224 | 362 | 647 | 10 | 10 |
| 165 | 667 | 539 | 6 | 18 | 225 | 342 | 631 | 10 | 10 |
| 166 | 803 | 0 | 0 | 0 | 226 | 342 | 599 | 10 | 10 |
| 167 | 803 | 900 | 0 | 112 | 227 | 322 | 567 | 10 | 10 |
| 168 | 587 | 292 | 240 | 240 | 228 | 322 | 647 | 10 | 10 |
| 169 | 567 | 372 | 20 | 80 | 229 | 302 | 631 | 10 | 10 |
| 170 | 587 | 692 | 240 | 240 | 230 | 302 | 599 | 10 | 10 |
| 171 | 567 | 772 | 20 | 80 | 231 | 282 | 567 | 10 | 10 |
| 172 | 187 | 92 | 240 | 240 | 232 | 282 | 647 | 10 | 10 |
| 173 | 267 | 332 | 80 | 20 | 233 | 306 | 601 | 42 | 6 |
| 174 | 407 | 632 | 40 | 120 | 234 | 304 | 603 | 6 | 34 |
| 175 | 126 | 759 | 10 | 10 | 235 | 306 | 633 | 42 | 6 |
| 176 | 122 | 807 | 10 | 10 | 236 | 242 | 567 | 10 | 10 |
| 177 | 122 | 727 | 10 | 10 | 237 | 242 | 647 | 10 | 10 |
| 178 | 142 | 743 | 10 | 10 | 238 | 222 | 631 | 10 | 10 |
| 179 | 142 | 775 | 10 | 10 | 239 | 222 | 599 | 10 | 10 |
| 180 | 144 | 747 | 6 | 34 | 240 | 224 | 603 | 6 | 34 |
| 241 | 198 | 615 | 10 | 10 | 301 | 436 | 572 | 20 | 80 |
| 242 | 202 | 567 | 10 | 10 | 302 | 196 | 92 | 240 | 240 |
| 243 | 202 | 647 | 10 | 10 | 303 | 436 | 172 | 20 | 80 |
| 244 | 182 | 631 | 10 | 10 | 304 | 456 | 187 | 40 | 370 |
| 245 | 182 | 599 | 10 | 10 | 305 | 493 | 187 | 420 | 10 |
| 246 | 184 | 603 | 6 | 34 | 306 | 493 | 547 | 420 | 10 |
| 247 | 206 | 617 | 22 | 6 | 307 | 493 | 523 | 420 | 10 |
| 248 | 158 | 615 | 10 | 10 | 308 | 811 | 525 | 10 | 30 |
| 249 | 162 | 567 | 10 | 10 | 309 | 525 | 427 | 388 | 10 |
| 250 | 162 | 647 | 10 | 10 | 310 | 523 | 309 | 10 | 126 |
| 251 | 142 | 631 | 10 | 10 | 311 | 525 | 307 | 388 | 10 |
| 252 | 142 | 599 | 10 | 10 | 312 | 521 | 233 | 14 | 14 |
| 253 | 144 | 603 | 6 | 34 | 313 | 553 | 233 | 14 | 14 |
| 254 | 166 | 617 | 22 | 6 | 314 | 553 | 281 | 14 | 14 |

TABLE II-continued

| RECORD NO. | WORD 1 X | WORD 2 Y | WORD 3 XL | WORD 4 YL | RECORD NO. | WORD 1 X | WORD 2 Y | WORD 3 XL | WORD 4 YL |
|---|---|---|---|---|---|---|---|---|---|
| 255 | 118 | 615 | 10 | 10 | 315 | 521 | 281 | 14 | 14 |
| 256 | 122 | 567 | 10 | 10 | 316 | 523 | 237 | 10 | 54 |
| 257 | 122 | 647 | 10 | 10 | 317 | 555 | 237 | 10 | 54 |
| 258 | 126 | 617 | 22 | 6 | 318 | 591 | 257 | 14 | 14 |
| 259 | 242 | 679 | 10 | 10 | 319 | 585 | 185 | 14 | 14 |
| 260 | 262 | 711 | 10 | 10 | 320 | 585 | 305 | 14 | 14 |
| 261 | 302 | 551 | 10 | 10 | 321 | 617 | 233 | 14 | 14 |
| 262 | 342 | 551 | 10 | 10 | 322 | 649 | 185 | 14 | 14 |
| 263 | 424 | 807 | 186 | 10 | 323 | 649 | 281 | 14 | 14 |
| 264 | 422 | 571 | 10 | 244 | 324 | 621 | 235 | 38 | 10 |
| 265 | 482 | 409 | 10 | 148 | 325 | 651 | 237 | 10 | 54 |
| 266 | 484 | 407 | 126 | 10 | 326 | 687 | 257 | 14 | 14 |
| 267 | 302 | 309 | 10 | 216 | 327 | 681 | 185 | 14 | 14 |
| 268 | 110 | 809 | 318 | 6 | 328 | 681 | 305 | 14 | 14 |
| 269 | 110 | 569 | 318 | 6 | 329 | 713 | 281 | 14 | 14 |
| 270 | 110 | 649 | 258 | 6 | 330 | 713 | 233 | 14 | 14 |
| 271 | 324 | 651 | 6 | 82 | 331 | 745 | 233 | 14 | 14 |
| 272 | 110 | 729 | 258 | 6 | 332 | 745 | 281 | 14 | 14 |
| 273 | 306 | 553 | 182 | 6 | 333 | 715 | 237 | 10 | 54 |
| 274 | 110 | 521 | 198 | 6 | 334 | 747 | 237 | 10 | 54 |
| 275 | 346 | 745 | 42 | 6 | 335 | 809 | 233 | 14 | 14 |
| 276 | 384 | 619 | 6 | 130 | 336 | 841 | 233 | 14 | 14 |
| 277 | 366 | 617 | 22 | 6 | 337 | 841 | 281 | 14 | 14 |
| 278 | 264 | 683 | 6 | 34 | 338 | 809 | 281 | 14 | 14 |
| 279 | 246 | 681 | 22 | 6 | 339 | 811 | 237 | 10 | 54 |
| 280 | 0 | 900 | 0 | 0 | 340 | 843 | 237 | 10 | 54 |
| 281 | 803 | 900 | 0 | 6 | 341 | 905 | 185 | 14 | 14 |
| 282 | 587 | 192 | 240 | 240 | 342 | 905 | 305 | 14 | 14 |
| 283 | 567 | 272 | 20 | 80 | 343 | 521 | 545 | 14 | 14 |
| 284 | 587 | 592 | 240 | 240 | 344 | 521 | 425 | 14 | 14 |
| 285 | 567 | 672 | 20 | 80 | 345 | 553 | 449 | 14 | 14 |
| 286 | 522 | 709 | 10 | 253 | 346 | 553 | 497 | 14 | 14 |
| 287 | 524 | 707 | 86 | 10 | 347 | 585 | 545 | 14 | 14 |
| 288 | −2409 | 0 | 0 | 0 | 348 | 585 | 425 | 14 | 14 |
| 289 | 803 | 900 | 0 | 6 | 349 | 555 | 453 | 10 | 54 |
| 290 | 196 | 592 | 240 | 240 | 350 | 623 | 473 | 14 | 14 |
| 291 | 436 | 672 | 20 | 80 | 351 | 617 | 545 | 14 | 14 |
| 292 | 196 | 192 | 240 | 240 | 352 | 617 | 425 | 14 | 14 |
| 293 | 436 | 272 | 20 | 80 | 353 | 649 | 449 | 14 | 14 |
| 294 | 433 | 707 | 66 | 10 | 354 | 649 | 497 | 14 | 14 |
| 295 | 491 | 709 | 10 | 253 | 355 | 681 | 545 | 14 | 14 |
| 296 | 0 | 900 | 0 | 0 | 356 | 681 | 425 | 14 | 14 |
| 297 | 803 | 900 | 0 | 109 | 357 | 651 | 453 | 10 | 54 |
| 298 | 596 | 692 | 240 | 240 | 358 | 809 | 545 | 14 | 14 |
| 299 | 676 | 672 | 80 | 20 | 359 | 873 | 545 | 14 | 14 |
| 300 | 196 | 492 | 240 | 240 | 360 | 873 | 425 | 14 | 14 |
| 361 | 809 | 425 | 14 | 14 | 421 | 392 | 525 | 10 | 30 |
| 362 | 841 | 497 | 14 | 14 | 422 | 110 | 427 | 803 | 10 |
| 363 | 841 | 449 | 14 | 14 | 423 | 110 | 307 | 803 | 10 |
| 364 | 905 | 497 | 14 | 14 | 424 | 328 | 309 | 10 | 126 |
| 365 | 905 | 449 | 14 | 14 | 425 | 520 | 309 | 10 | 126 |
| 366 | 845 | 499 | 70 | 10 | 426 | 896 | 257 | 14 | 14 |
| 367 | 907 | 453 | 10 | 54 | 427 | 902 | 185 | 14 | 14 |
| 368 | 845 | 451 | 70 | 10 | 428 | 902 | 305 | 14 | 14 |
| 369 | 873 | 113 | 14 | 14 | 429 | 870 | 281 | 14 | 14 |
| 370 | 537 | 113 | 14 | 14 | 430 | 870 | 233 | 14 | 14 |
| 371 | 633 | 137 | 14 | 14 | 431 | 872 | 237 | 10 | 54 |
| 372 | 777 | 329 | 14 | 14 | 432 | 832 | 257 | 14 | 14 |
| 373 | 873 | 353 | 14 | 14 | 433 | 838 | 185 | 14 | 14 |
| 374 | 825 | 353 | 14 | 14 | 434 | 838 | 305 | 14 | 14 |
| 375 | 729 | 353 | 14 | 14 | 435 | 806 | 281 | 14 | 14 |
| 376 | 553 | 353 | 14 | 14 | 436 | 806 | 233 | 14 | 14 |
| 377 | 537 | 593 | 14 | 14 | 437 | 808 | 237 | 10 | 54 |
| 378 | 745 | 161 | 14 | 14 | 438 | 842 | 259 | 38 | 10 |
| 379 | 553 | 161 | 14 | 14 | 439 | 768 | 257 | 14 | 14 |
| 380 | 521 | 161 | 14 | 14 | 440 | 774 | 185 | 14 | 14 |
| 381 | 553 | 401 | 14 | 14 | 441 | 774 | 305 | 14 | 14 |
| 382 | 649 | 401 | 14 | 14 | 442 | 742 | 281 | 14 | 14 |
| 383 | 841 | 569 | 14 | 14 | 443 | 742 | 233 | 14 | 14 |
| 384 | 905 | 569 | 14 | 14 | 444 | 744 | 237 | 10 | 54 |
| 385 | 637 | 139 | 276 | 10 | 445 | 778 | 259 | 38 | 10 |
| 386 | 491 | 62 | 10 | 109 | 446 | 704 | 257 | 14 | 14 |
| 387 | 493 | 163 | 38 | 10 | 447 | 710 | 185 | 14 | 14 |
| 388 | 433 | 595 | 114 | 10 | 448 | 710 | 305 | 14 | 14 |
| 389 | 711 | 621 | 10 | 74 | 449 | 678 | 281 | 14 | 14 |
| 390 | 713 | 619 | 138 | 10 | 450 | 678 | 233 | 14 | 14 |
| 391 | 843 | 573 | 10 | 54 | 451 | 680 | 237 | 10 | 54 |
| 392 | 845 | 571 | 70 | 10 | 452 | 714 | 259 | 38 | 10 |
| 393 | 541 | 115 | 372 | 10 | 453 | 640 | 257 | 14 | 14 |
| 394 | 557 | 163 | 198 | 10 | 454 | 646 | 185 | 14 | 14 |
| 395 | 907 | 213 | 10 | 54 | 455 | 646 | 305 | 14 | 14 |
| 396 | 845 | 259 | 70 | 10 | 456 | 614 | 281 | 14 | 14 |
| 397 | 811 | 213 | 10 | 30 | 457 | 614 | 233 | 14 | 14 |
| 398 | 653 | 211 | 166 | 10 | 458 | 616 | 237 | 10 | 54 |
| 399 | 651 | 213 | 10 | 54 | 459 | 650 | 259 | 38 | 10 |
| 400 | 653 | 259 | 38 | 10 | 460 | 576 | 257 | 14 | 14 |
| 401 | 557 | 259 | 38 | 10 | 461 | 582 | 185 | 14 | 14 |
| 402 | 557 | 331 | 406 | 10 | 462 | 582 | 305 | 14 | 14 |
| 403 | 555 | 333 | 10 | 78 | 463 | 550 | 281 | 14 | 14 |
| 404 | 651 | 357 | 10 | 54 | 464 | 550 | 233 | 14 | 14 |

TABLE II-continued

| RECORD NO. | WORD 1 X | WORD 2 Y | WORD 3 XL | WORD 4 YL | RECORD NO. | WORD 1 X | WORD 2 Y | WORD 3 XL | WORD 4 YL |
|---|---|---|---|---|---|---|---|---|---|
| 405 | 653 | 355 | 230 | 10 | 465 | 552 | 237 | 10 | 54 |
| 406 | 557 | 475 | 70 | 10 | 466 | 586 | 259 | 38 | 10 |
| 407 | 803 | 0 | 0 | 0 | 467 | 512 | 257 | 14 | 14 |
| 408 | 803 | 900 | 0 | 190 | 468 | 518 | 185 | 14 | 14 |
| 409 | 593 | 692 | 240 | 240 | 469 | 518 | 305 | 14 | 14 |
| 410 | 673 | 672 | 80 | 20 | 470 | 486 | 281 | 14 | 14 |
| 411 | 193 | 692 | 240 | 240 | 471 | 486 | 233 | 14 | 14 |
| 412 | 273 | 672 | 80 | 20 | 472 | 488 | 237 | 10 | 54 |
| 413 | 705 | 622 | 208 | 20 | 473 | 522 | 259 | 38 | 10 |
| 414 | 703 | 624 | 20 | 76 | 474 | 448 | 257 | 14 | 14 |
| 415 | 110 | 187 | 803 | 10 | 475 | 454 | 185 | 14 | 14 |
| 416 | 110 | 547 | 803 | 10 | 476 | 454 | 305 | 14 | 14 |
| 417 | 520 | 525 | 10 | 30 | 477 | 422 | 281 | 14 | 14 |
| 418 | 110 | 523 | 418 | 10 | 478 | 422 | 233 | 14 | 14 |
| 419 | 168 | 525 | 10 | 30 | 479 | 424 | 237 | 10 | 54 |
| 420 | 296 | 525 | 10 | 30 | 480 | 458 | 259 | 38 | 10 |
| 481 | 390 | 185 | 14 | 14 | 541 | 554 | 379 | 54 | 10 |
| 482 | 390 | 305 | 14 | 14 | 542 | 552 | 333 | 10 | 54 |
| 483 | 358 | 281 | 14 | 14 | 543 | 362 | 379 | 54 | 10 |
| 484 | 358 | 233 | 14 | 14 | 544 | 360 | 333 | 10 | 54 |
| 485 | 360 | 237 | 10 | 54 | 545 | 362 | 283 | 70 | 10 |
| 486 | 390 | 545 | 14 | 14 | 546 | 426 | 571 | 70 | 10 |
| 487 | 454 | 545 | 14 | 14 | 547 | 488 | 573 | 10 | 30 |
| 488 | 518 | 545 | 14 | 14 | 548 | 490 | 595 | 423 | 10 |
| 489 | 518 | 425 | 14 | 14 | 549 | 108 | 257 | 14 | 14 |
| 490 | 454 | 425 | 14 | 14 | 550 | 134 | 281 | 14 | 14 |
| 491 | 390 | 425 | 14 | 14 | 551 | 134 | 233 | 14 | 14 |
| 492 | 422 | 497 | 14 | 14 | 552 | 136 | 237 | 10 | 54 |
| 493 | 422 | 449 | 14 | 14 | 553 | 172 | 257 | 14 | 14 |
| 494 | 486 | 497 | 14 | 14 | 554 | 166 | 185 | 14 | 14 |
| 495 | 486 | 449 | 14 | 14 | 555 | 166 | 305 | 14 | 14 |
| 496 | 426 | 499 | 70 | 10 | 556 | 198 | 233 | 14 | 14 |
| 497 | 488 | 453 | 10 | 54 | 557 | 230 | 185 | 14 | 14 |
| 498 | 426 | 451 | 70 | 10 | 558 | 230 | 281 | 14 | 14 |
| 499 | 582 | 545 | 14 | 14 | 559 | 202 | 235 | 38 | 10 |
| 500 | 582 | 425 | 14 | 14 | 560 | 232 | 237 | 10 | 54 |
| 501 | 614 | 449 | 14 | 14 | 561 | 262 | 233 | 14 | 14 |
| 502 | 614 | 497 | 14 | 14 | 562 | 294 | 233 | 14 | 14 |
| 503 | 616 | 453 | 10 | 54 | 563 | 294 | 281 | 14 | 14 |
| 504 | 652 | 473 | 14 | 14 | 564 | 262 | 281 | 14 | 14 |
| 505 | 646 | 545 | 14 | 14 | 565 | 264 | 237 | 10 | 54 |
| 506 | 646 | 425 | 14 | 14 | 566 | 296 | 237 | 10 | 54 |
| 507 | 678 | 449 | 14 | 14 | 567 | 134 | 545 | 14 | 14 |
| 508 | 678 | 497 | 14 | 14 | 568 | 134 | 425 | 14 | 14 |
| 509 | 680 | 453 | 10 | 54 | 569 | 166 | 545 | 14 | 14 |
| 510 | 618 | 475 | 38 | 10 | 570 | 230 | 545 | 14 | 14 |
| 511 | 716 | 473 | 14 | 14 | 571 | 294 | 545 | 14 | 14 |
| 512 | 710 | 545 | 14 | 14 | 572 | 294 | 425 | 14 | 14 |
| 513 | 710 | 425 | 14 | 14 | 573 | 230 | 425 | 14 | 14 |
| 514 | 742 | 449 | 14 | 14 | 574 | 166 | 425 | 14 | 14 |
| 515 | 742 | 497 | 14 | 14 | 575 | 198 | 497 | 14 | 14 |
| 516 | 744 | 453 | 10 | 54 | 576 | 198 | 449 | 14 | 14 |
| 517 | 682 | 475 | 38 | 10 | 577 | 262 | 497 | 14 | 14 |
| 518 | 780 | 473 | 14 | 14 | 578 | 262 | 449 | 14 | 14 |
| 519 | 774 | 545 | 14 | 14 | 579 | 202 | 499 | 70 | 10 |
| 520 | 774 | 425 | 14 | 14 | 580 | 264 | 453 | 10 | 54 |
| 521 | 806 | 449 | 14 | 14 | 581 | 202 | 451 | 70 | 10 |
| 522 | 806 | 497 | 14 | 14 | 582 | 278 | 113 | 14 | 14 |
| 523 | 808 | 453 | 10 | 54 | 583 | 214 | 137 | 14 | 14 |
| 524 | 746 | 475 | 38 | 10 | 584 | 278 | 353 | 14 | 14 |
| 525 | 844 | 473 | 14 | 14 | 585 | 198 | 569 | 14 | 14 |
| 526 | 838 | 545 | 14 | 14 | 586 | 262 | 569 | 14 | 14 |
| 527 | 838 | 425 | 14 | 14 | 587 | 110 | 139 | 803 | 10 |
| 528 | 870 | 449 | 14 | 14 | 588 | 308 | 621 | 10 | 74 |
| 529 | 870 | 497 | 14 | 14 | 589 | 266 | 619 | 50 | 10 |
| 530 | 872 | 453 | 10 | 54 | 590 | 264 | 573 | 10 | 54 |
| 531 | 810 | 475 | 38 | 10 | 591 | 202 | 571 | 70 | 10 |
| 532 | 902 | 545 | 14 | 14 | 592 | 110 | 115 | 178 | 10 |
| 533 | 902 | 425 | 14 | 14 | 593 | 296 | 213 | 10 | 30 |
| 534 | 874 | 475 | 38 | 10 | 594 | 106 | 211 | 198 | 10 |
| 535 | 598 | 377 | 14 | 14 | 595 | 138 | 259 | 38 | 10 |
| 536 | 406 | 377 | 14 | 14 | 596 | 234 | 235 | 38 | 10 |
| 537 | 550 | 329 | 14 | 14 | 597 | 154 | 355 | 134 | 10 |
| 538 | 358 | 329 | 14 | 14 | 598 | 152 | 333 | 10 | 30 |
| 539 | 486 | 569 | 14 | 14 | 599 | 803 | 0 | 0 | 0 |
| 540 | 422 | 569 | 14 | 14 | 600 | 803 | 900 | 0 | 117 |
| 601 | 590 | 692 | 240 | 240 | 661 | 259 | 449 | 14 | 14 |
| 602 | 670 | 672 | 80 | 20 | 662 | 259 | 497 | 14 | 14 |
| 603 | 190 | 692 | 240 | 240 | 663 | 261 | 453 | 10 | 54 |
| 604 | 270 | 672 | 80 | 20 | 664 | 199 | 475 | 38 | 10 |
| 605 | 476 | 308 | 28 | 128 | 665 | 297 | 473 | 14 | 14 |
| 606 | 486 | 424 | 20 | 216 | 666 | 291 | 545 | 14 | 14 |
| 607 | 110 | 622 | 394 | 20 | 667 | 291 | 425 | 14 | 14 |
| 608 | 110 | 187 | 351 | 10 | 668 | 323 | 449 | 14 | 14 |
| 609 | 110 | 547 | 255 | 10 | 669 | 323 | 497 | 14 | 14 |
| 610 | 110 | 427 | 383 | 10 | 670 | 325 | 453 | 10 | 54 |
| 611 | 110 | 307 | 383 | 10 | 671 | 263 | 475 | 38 | 10 |
| 612 | 451 | 185 | 14 | 14 | 672 | 355 | 545 | 14 | 14 |
| 613 | 451 | 305 | 14 | 14 | 673 | 355 | 425 | 14 | 14 |
| 614 | 419 | 281 | 14 | 14 | 674 | 387 | 449 | 14 | 14 |

TABLE II-continued

| RECORD NO. | WORD 1 X | WORD 2 Y | WORD 3 XL | WORD 4 YL | RECORD NO. | WORD 1 X | WORD 2 Y | WORD 3 XL | WORD 4 YL |
|---|---|---|---|---|---|---|---|---|---|
| 615 | 419 | 233 | 14 | 14 | 675 | 387 | 497 | 14 | 14 |
| 616 | 421 | 237 | 10 | 54 | 676 | 389 | 453 | 10 | 54 |
| 617 | 381 | 257 | 14 | 14 | 677 | 419 | 497 | 14 | 14 |
| 618 | 387 | 185 | 14 | 14 | 678 | 451 | 497 | 14 | 14 |
| 619 | 387 | 305 | 14 | 14 | 679 | 451 | 449 | 14 | 14 |
| 620 | 355 | 233 | 14 | 14 | 680 | 419 | 449 | 14 | 14 |
| 621 | 323 | 185 | 14 | 14 | 681 | 421 | 453 | 10 | 54 |
| 622 | 323 | 281 | 14 | 14 | 682 | 453 | 453 | 10 | 54 |
| 623 | 327 | 235 | 38 | 10 | 683 | 435 | 137 | 14 | 14 |
| 624 | 325 | 237 | 10 | 54 | 684 | 523 | 617 | 14 | 14 |
| 625 | 285 | 257 | 14 | 14 | 685 | 459 | 593 | 14 | 14 |
| 626 | 291 | 185 | 14 | 14 | 686 | 419 | 593 | 14 | 14 |
| 627 | 291 | 305 | 14 | 14 | 687 | 371 | 657 | 14 | 14 |
| 628 | 259 | 281 | 14 | 14 | 688 | 339 | 377 | 14 | 14 |
| 629 | 259 | 233 | 14 | 14 | 689 | 279 | 593 | 14 | 14 |
| 630 | 261 | 237 | 10 | 54 | 690 | 271 | 593 | 14 | 14 |
| 631 | 295 | 259 | 38 | 10 | 691 | 279 | 657 | 14 | 14 |
| 632 | 221 | 257 | 14 | 14 | 692 | 271 | 657 | 14 | 14 |
| 633 | 227 | 185 | 14 | 14 | 693 | 323 | 401 | 14 | 14 |
| 634 | 227 | 305 | 14 | 14 | 694 | 419 | 401 | 14 | 14 |
| 635 | 195 | 281 | 14 | 14 | 695 | 451 | 569 | 14 | 14 |
| 636 | 195 | 233 | 14 | 14 | 696 | 387 | 569 | 14 | 14 |
| 637 | 197 | 237 | 10 | 54 | 697 | 439 | 139 | 134 | 10 |
| 638 | 231 | 259 | 38 | 10 | 698 | 565 | 141 | 10 | 366 |
| 639 | 157 | 257 | 14 | 14 | 699 | 567 | 499 | 346 | 10 |
| 640 | 163 | 185 | 14 | 14 | 700 | 543 | 547 | 370 | 10 |
| 641 | 163 | 305 | 14 | 14 | 701 | 541 | 213 | 10 | 342 |
| 642 | 131 | 281 | 14 | 14 | 702 | 391 | 211 | 158 | 10 |
| 643 | 131 | 233 | 14 | 14 | 703 | 389 | 213 | 10 | 54 |
| 644 | 133 | 237 | 10 | 54 | 704 | 423 | 283 | 102 | 10 |
| 645 | 167 | 259 | 38 | 10 | 705 | 517 | 285 | 10 | 318 |
| 646 | 103 | 259 | 38 | 10 | 706 | 519 | 595 | 394 | 10 |
| 647 | 105 | 473 | 14 | 14 | 707 | 527 | 619 | 386 | 10 |
| 648 | 131 | 449 | 14 | 14 | 708 | 453 | 573 | 10 | 30 |
| 649 | 131 | 497 | 14 | 14 | 709 | 375 | 663 | 338 | 10 |
| 650 | 133 | 453 | 10 | 54 | 710 | 705 | 665 | 10 | 30 |
| 651 | 169 | 473 | 14 | 14 | 711 | 391 | 595 | 38 | 10 |
| 652 | 163 | 545 | 14 | 14 | 712 | 389 | 573 | 10 | 30 |
| 653 | 163 | 425 | 14 | 14 | 713 | 327 | 403 | 102 | 10 |
| 654 | 195 | 449 | 14 | 14 | 714 | 341 | 381 | 10 | 30 |
| 655 | 195 | 497 | 14 | 14 | 715 | 110 | 595 | 175 | 10 |
| 656 | 197 | 453 | 10 | 54 | 716 | 279 | 667 | 34 | 10 |
| 657 | 135 | 475 | 38 | 10 | 717 | 110 | 139 | 335 | 10 |
| 658 | 233 | 473 | 14 | 14 | 718 | 803 | 0 | 0 | 0 |
| 659 | 227 | 545 | 14 | 14 | 719 | 803 | 900 | 0 | 14 |
| 660 | 227 | 425 | 14 | 14 | 720 | 587 | 92 | 240 | 240 |
| 721 | 567 | 172 | 20 | 80 | | | | | |
| 722 | 587 | 492 | 240 | 240 | | | | | |
| 723 | 567 | 572 | 20 | 80 | | | | | |
| 724 | 187 | 692 | 240 | 240 | | | | | |
| 725 | 267 | 672 | 80 | 20 | | | | | |
| 726 | 110 | 499 | 420 | 10 | | | | | |
| 727 | 522 | 62 | 10 | 445 | | | | | |
| 728 | 544 | 211 | 66 | 10 | | | | | |
| 729 | 542 | 213 | 10 | 342 | | | | | |
| 730 | 110 | 547 | 440 | 10 | | | | | |
| 731 | 110 | 595 | 500 | 10 | | | | | |
| 732 | 302 | 621 | 10 | 74 | | | | | |
| 733 | 110 | 619 | 200 | 10 | | | | | |
| 734 | −1205 | −900 | 0 | 0 | | | | | |
| 735 | 0 | 0 | 0 | 0 | | | | | |
| 736 | 23 | 8224 | 8224 | 8224 | | | | | |

What is claimed is:

1. The method of scanning a pattern on a work piece where the pattern covers a pattern area and where the pattern area is divided into a plurality of contiguous partitions each having a partition area smaller than said pattern area, the steps comprising,
  generating for an exposing beam a scan field having a scan area greater than said partition area,
  relatively moving said scan field and said work piece to successively move said scan field to scan each of said partitions whereby an overlapping boundary region exists between the scan field relative to one of said partitions and the scan field relative to another one of said partitions contiguous to said one of said partitions,
  selectively controlling the exposing beam in said overlapping boundary region to selectively expose portions of said pattern in said boundary region either in connection with the scan field of said one of said partitions or in connection with the scan field of said another one of said partitions.

2. The method of claim 1 including controlling said exposing beam in said overlapping boundary region to expose portions of said pattern, located in said boundary region and located within said one of said partitions, only in connection with the scan field of said another one of said partitions.

3. The method of claim 1 wherein said pattern is defined by a plurality of abutting shapes having a location and size identified with respect to a common origin for said pattern area, the additional step comprising allocating said shapes among said partitions in accordance with a predetermined algorithm whereby a single exposure of all portions of each shape occurs.

4. The method of claim 3 wherein said algorithm includes the step of allocating shapes contained entirely within said one of said partitions entirely to said one of said partitions.

5. The method of claim 3 wherein said algorithm includes the step of allocating a shape, contained in said one of said partitions and contained only within that portion of said another one of said partitions within said overlapping boundary region, entirely to said one of said partitions.

6. The method of claim 4 wherein said algorithm includes the step of exposing a shape which is contained entirely within said overlapping boundary region entirely within said one or said another one of said partitions having the largest percentage of the area of said shape.

7. The method of claim 3 wherein said algorithm is executed for each shape first in one direction to determine partitioning along one axis and thereafter in an orthogonal direction to determine partitioning along a second axis orthogonal to said first axis.

8. The method of claim 3 wherein said partitions are arrayed in orthogonal rows and columns and wherein said algorithm is executed first with respect to said columns to determine allocation of shapes within each column of said partitions and whereafter said algorithm is executed with respect to rows for each of the shapes in each of said columns whereby the row and column allocation of each shape is determined.

9. The method of claim 8 including the step of sorting the shapes allocated to each partition, exposing each shape allocated to a particular partition, and relatively moving the scan field and the work piece to a next partition, and exposing each shape allocated to said next partition.

10. The method of claim 9 wherein said shapes are rectangles.

11. An apparatus for scanning a pattern on a work piece where the pattern covers a pattern area and where the pattern area is divided into a plurality of contiguous partitions each having a partition area smaller than said pattern area, comprising,
    means for generating a scan field having a scan area greater than said partition area,
    means for relatively moving said scan field and said work piece to successively move said scan field to scan each of said partitions whereby an overlapping boundary region exists between the scan field relative to one of said partitions and the scan field relative to another one of said partitions contiguous to said one of said partitions,
    control means for selectively controlling the exposing beam in said overlapping boundary region to selectively expose portions of said pattern in said boundary region either in connection with the scan field of said one of said partitions or in connection with the scan field of said another one of said partitions.

12. The apparatus of claim 11 wherein said control means includes means for controlling said exposing beam in said overlapping boundary region to expose a portion of said pattern, located in said boundary region and located within said one of said partitions, only in connection with the scan field of said another one of said partitions.

13. The method of scanning a pattern on a resist-coated work piece to form semiconductor circuits where the pattern covers a pattern area and where the pattern area is divided into a plurality of partitions each having a partition area smaller than said pattern area where adjacent partitions abut along a partition boundary, the steps comprising,
    generating for an exposing beam, a scan field having a scan area greater than said partition area,
    relatively positioning said scan field and said work piece with some positional error to successively move said scan field to scan each of said partitions whereby an overlapping boundary region exists between the scan field relative to one of said partitions and the scan field relative to another one of said partitions contiguous to said one of said partitions, said overlapping boundary region containing portions of said pattern defining particular dimensions of the semiconductor circuit, said positional error being substantial with respect to said particular dimensions,
    selectively controlling the exposing beam in said overlapping boundary region to selectively expose portions of said pattern in said boundary region either in connection with the scan field of said one of said partitions or in connection with the scan field of said another one of said partitions whereby said particular dimensions are exposed entirely in said one or in said another one of said partitions so that said positional error does not alter said particular dimensions.

14. An apparatus for scanning a pattern on a resist-coated work piece to form semiconductor circuits where the pattern covers a pattern area and where the pattern area is divided into a plurality of partitions each having a partition area smaller than said pattern area where adjacent partitions abut along a partition boundary, comprising,
    means for generating for an exposing beam, a scan field having a scan area greater than said partition area,
    means for relatively positioning said scan field and said work piece with some positional error to successively move said scan field to scan each of said partitions whereby an overlapping boundary region exists between the scan field relative to one of said partitions and the scan field relative to another one of said partitions contiguous to said one of said partitions, said overlapping boundary region containing portions of said pattern defining particular dimensions of the semiconductor circuit, said positional error being substantial with respect to said particular dimensions,
    means for selectively controlling the exposing beam in said overlapping boundary region to selectively expose portions of said pattern in said boundary region either in connection with the scan field of said one of said partitions or in connection with the scan field of said another one of said partitions whereby said particular dimensions are exposed entirely in said one or in said another one of said partitions so that said positional error does not alter said particular dimensions.

15. An electron beam apparatus for scanning a pattern on a resist-coated work piece to form semiconductor circuits where the pattern covers a pattern area and where the pattern area is divided into a plurality of partitions each having a partition area smaller than said pattern area where adjacent partitions abut along a partition boundary, comprising,
    an electron beam column apparatus having means for generating an electron beam, blanking means for selectively blanking the electron beam in connection with scanning a pattern, and deflection means for deflecting the electron beam, generator means for providing control signals to said deflection means to scan said electron beam over a scan field having a scan area greater than said partition area, positioning means for positioning said work piece at commanded positions relative to said scan field, control means for successively supplying commanded positions to said positioning means whereby said work piece is positioned relative to said scan field to scan each of said partitions with an overlapping boundary region between the scan field relative to one of said partitions and the scan field relative to another adjacent one of said partitions, said overlapping boundary region containing portions of said pattern defining particular dimensions of a semiconductor circuit, said one of and said adjacent one of said partitions abutting in said boundary region with some positional error, means for measuring the actual position of said electron beam on said work piece, means for forming error signals as a function of the difference between said commanded position and said actual position, means for adding said error signals to said control signals whereby said electron beam is positioned more accurately relative to said work piece, means for selectively controlling said blanking means for selectively blanking the electron beam during the scanning of said overlapping boundary region to selectively expose portions of said pattern in said boundary region either in connection with the scan field of said one of said partitions or in connection with the scan field of said another one of said partitions whereby said particular dimensions are exposed entirely in said one or in said another one of said partitions so that said positional error does not affect said particular dimensions.

16. The apparatus of claim 15 wherein said means for selectively controlling includes memory means for separately storing digital representations of portions of the pattern for each separate partition area and includes means for accessing said digital representations for each separate partition area one at a time for each partition area.

17. The apparatus of claim 16 wherein said generator means includes means for controlling said scanning for positions of said electron beam having corresponding digital representations in said memory means.

18. The apparatus of claim 17 wherein said digital representations include X axis and Y axis representations.

* * * * *